US010066287B2

(12) United States Patent
Voser et al.

(10) Patent No.: US 10,066,287 B2
(45) Date of Patent: Sep. 4, 2018

(54) DIRECT LIQUID DEPOSITION

(71) Applicant: Oerlikon Advanced Technologies AG, Balzers (LI)

(72) Inventors: Stephan Voser, Sevelen (CH); Fabio Antonio Ravelli, Buchs (CH); Bruno Gaechter, Ruethi (CH)

(73) Assignee: EVATEC AG, Trübbach (CH)

( * ) Notice: Subject to any disclaimer, the term of this patent is extended or adjusted under 35 U.S.C. 154(b) by 355 days.

(21) Appl. No.: 14/849,818

(22) Filed: Sep. 10, 2015

(65) Prior Publication Data

US 2015/0376770 A1   Dec. 31, 2015

Related U.S. Application Data

(63) Continuation of application No. 13/655,501, filed on Oct. 19, 2012, now Pat. No. 9,593,407.

(60) Provisional application No. 61/550,013, filed on Oct. 21, 2011, provisional application No. 61/642,074, filed on May 3, 2012.

(51) Int. Cl.
| C23C 14/22 | (2006.01) |
| C23C 14/24 | (2006.01) |
| C23C 14/26 | (2006.01) |
| B05B 7/16 | (2006.01) |
| B05B 1/06 | (2006.01) |
| C23C 14/12 | (2006.01) |
| C23C 14/02 | (2006.01) |
| C23C 14/50 | (2006.01) |

(52) U.S. Cl.
CPC .............. *C23C 14/228* (2013.01); *B05B 1/06* (2013.01); *B05B 7/1686* (2013.01); *C23C 14/021* (2013.01); *C23C 14/024* (2013.01); *C23C 14/12* (2013.01); *C23C 14/24* (2013.01); *C23C 14/26* (2013.01); *C23C 14/50* (2013.01)

(58) Field of Classification Search
CPC ....... C23C 14/24; C23C 14/243; C23C 14/26; C23C 14/228; C23C 16/448; B05B 1/24; B05B 7/0416; B05B 7/1686; B05B 7/1693

See application file for complete search history.

(56) References Cited

U.S. PATENT DOCUMENTS

| 4,392,453 A | 7/1983 | Luscher |
| 4,565,158 A | 1/1986 | Koprio |
| 5,711,816 A * | 1/1998 | Kirlin ..................... C23C 16/18 |
| | | 118/726 |

(Continued)

FOREIGN PATENT DOCUMENTS

| DE | 10211573 A1 | 10/2003 |
| EP | 1493837 A1 | 1/2005 |

*Primary Examiner* — Ryan Alexander Reis
(74) *Attorney, Agent, or Firm* — Pearne & Gordon LLP

(57) ABSTRACT

Liquid precursor material of a coating substance and a solvent is provided in a reservoir (STEP1, STEP1'). In one variant the liquid precursor material is distilled (STEP2), the resultant liquid coating substance is vaporized (STEP3) and ejected through a vapor distribution nozzle arrangement (7) into a vacuum recipient (3) and onto substrate 5 to be coated. Alternatively, the liquid precursor material is directly vaporized (STEP3'). From the two-component vapor coating substance vapor is applied to substrate 5' to be coated. In this variant separation of solvent vapor and coating substance vapor is performed especially downstream vaporizing (STEP2').

26 Claims, 13 Drawing Sheets

(56) References Cited

U.S. PATENT DOCUMENTS

| | | | |
|---|---|---|---|
| 6,011,904 A | 1/2000 | Mattord | |
| 6,099,896 A * | 8/2000 | Stirniman | B05D 1/60 118/50 |
| 6,663,025 B1 * | 12/2003 | Halsey | C23C 14/566 118/715 |
| 7,975,993 B2 * | 7/2011 | Ono | C23C 16/4486 261/103 |
| 2003/0175422 A1 * | 9/2003 | Cord | B05D 1/60 427/248.1 |
| 2007/0101940 A1 * | 5/2007 | Iizuka | C23C 16/4486 118/726 |
| 2009/0011127 A1 | 1/2009 | Kuper | |
| 2009/0320755 A1 * | 12/2009 | Liu | C23C 14/022 118/719 |
| 2010/0247803 A1 * | 9/2010 | Lee | C23C 16/30 427/563 |
| 2011/0195187 A1 | 8/2011 | Weber et al. | |

* cited by examiner (a)  (b)  (c)

DIRECT LIQUID DEPOSITION

BACKGROUND OF THE INVENTION

This invention relates to vacuum coating processes and devices. Specifically, the coating devices and processes allow for applying thin coating layers by means of so-called Direct Liquid Deposition on the surface of substrates. The term substrates is to be understood broadly: it may include but is not limited to flat or shaped (3-D) workpieces from semiconductor materials (e.g. wafer of circular or rectangular or irregular shape), plastic, ceramics, glass, metal or compounds thereof.

The invention has a wide spectrum of applications, ranging from depositing organic semiconductor (like OLED, Organic Photo-voltaic OPV, Organic Electronic) to depositing functional coatings (like anti-fouling, oleophobic, hydrophobic, protective or easy to clean treatments, e. g. for touch-panels). However, the invention is not limited to these applications.

Generically, Direct Liquid Deposition (DLD) processes fall within the broadest understanding of the family of deposition processes known as Physical Vapour Deposition (PVD) processes. In its simplest form, DLD comprises evaporating a liquid substance, such as a lubricant, a polymer or a polymer precursor material, in a heated vacuum recipient and causing at least one component of the substance to condense on the cooler surface of a substrate under vacuum which is at a temperature below the evaporation point of the substance at the pressure in the vacuum recipient. In the case of a polymer precursor material, this polymer precursor material may also polymerise on the surface, or later be cured e.g. by heat and/or humidity and/or ultraviolet light. The liquid is thus directly deposited upon the substrate surface with no chemical changes thereto: the only changes that take place are phase changes from liquid to vapour and back. Generically, the term "coating substance" is used in the present specification to refer to the substance at least one component of which is intended to be deposited on the substrate. "Precursor material" is used to refer to e.g. the coating substance dissolved in a solvent so as to create a solution.

Commonly, the coating substance to be deposited is extremely viscous, and thus difficult to handle. In consequence, the coating substance is dissolved as a solute in a solvent to create a liquid precursor material which has a significantly lower viscosity than the coating substance itself, which permits easy handling, dosing, and so on. Furthermore, in the case of the coating substance having the tendency to autopolymerise, the solvent helps to stabilise the coating substance and thereby prevent it from autopolymerising, and thereby thickening further which then requires a greater temperature for evaporation.

However, the presence of the solvent can affect the quality of the deposited coating. The solvent will have a boiling point significantly lower than that of the coating substance, which can cause splashing of the coating substance at the point of evaporation, in the worst-case leading to spots of liquid on the substrate. Furthermore, as the solvent evaporates progressively during deposition, the quality of the coating deposited can vary due to the composition of vaporised liquid substance/solvent in the vacuum recipient varying as one dose of precursor material evaporates.

US 2011/0195187 attempts to overcome some of these disadvantages in the context of applying oleophobic coatings to substrates on the basis of a liquid precursor material comprising a coating substance dissolved in a solvent. This document proposes a vaporising unit situated in the vacuum recipient itself. The liquid precursor material is fed into the vaporising unit, and is subjected first to an in-situ distillation step in which the solvent is evaporated out of the liquid precursor material under a first pressure and/or temperature regime, and a subsequent evaporation step in which the coating substance is evaporated under a second pressure and/or temperature regime. This is a slow, two-step process, and experimentation by the Applicant has shown the results of this process to be not entirely satisfactory, particularly with regard to the quality of the coating varying over the deposition time. Furthermore, since the process is slow, the coating substance is exposed to relatively high heat for a relatively long time, causing degradation of the substance, e.g. by autopolymerisation. This further reduces the quality of the coating.

US 2003/0175422 describes a vapour distribution arrangement for depositing lubricant films by Direct Liquid Deposition on the surfaces of computer hard disks. However, this arrangement has proven unsatisfactory for deposition of oleophobic coatings due to condensation of the material on parts of the nozzle, leading to a (partially) clogged nozzle, and uneven distribution of the coating.

SUMMARY OF THE INVENTION

The object of the present invention is thus to overcome at least one of the above-mentioned disadvantages, and thereby to further improve the coating quality and to improve the coating speed.

First Aspect of the Invention

An object of the present invention is attained in a first aspect of the invention by a method of manufacturing a coated substrate comprising providing a vapour distribution nozzle arrangement in a vacuum recipient. The vapour distribution nozzle arrangement comprises an ejection opening arrangement for ejecting vapour. An arrangement of at least one substrate, which substrate can be for instance at least one cover glass of a smart phone or other portable device, is also provided in the vacuum recipient, which latter is then evacuated at the latest when said substrate arrangement is provided therein. The vacuum recipient may be constantly maintained under vacuum, or may be evacuated once the substrate arrangement has been entered into the vacuum recipient.

A liquid precursor material comprising a coating substance, at least one component of which is destined to be deposited on the substrate or substrates, dissolved in a solvent is distilled so as to separate the solvent from the coating substance and thereby to recover the coating substance. A part of the result of this distillation, i.e. a fraction of the of the thus-recovered coating substance, is thermally vaporised as a predetermined portion, and at least part of this thermally vaporised predetermined portion is ejected through the objection opening arrangement into the vacuum recipient, where it deposits on the substrate or substrates. Subsequently, the arrangement of substrates is removed from the vacuum recipient.

In consequence, since the distillation of the precursor material takes place separate to the vaporisation of the precursor material, substantially no solvent is present in the vacuum recipient during deposition, leading to improved coating evenness and coating quality. Furthermore, vaporising only a fraction of the result of the distillation enables faster deposition, since only sufficient precursor material need be evaporated for one or several "shots" of vapour, each shot being sufficient to deposit a coating of the desired thickness on the substrate or substrates present in the vacuum recipient at that time. In consequence, vaporisation of relatively large quantities of coating material at any one time is avoided, avoiding excessive exposure of the precursor material to relatively high heat prior to vaporisation, reducing deterioration of the coating substance, thus improving the coating quality.

In an embodiment of the method of the first aspect of the invention, which may be combined with any subsequent embodiment not in contradiction therewith, the result of the vaporising is ejected in a single shot, that is to say that all of the vapour produced by vaporising the predetermined portion of coating substance is ejected in a single shot. This results in that the coating substance vapour does not have to be stored in the vapour phase, simplifying the method.

In an alternative embodiment of the method of the first aspect of the invention, which may be combined with any subsequent embodiment not in contradiction therewith, the result of the vaporising is ejected in more than one time discrete shots. Thus, the predetermined portion of coating substance vaporised is sufficient for several coating shots, and this vapour is held ready and released in several discrete shots. This results in easier handling of the coating substance in its liquid form, since larger predetermined portions can be produced, which is easier to achieve in practice, since dosing and handling extremely small quantities of liquids can be technically difficult.

In an embodiment of the method of the first aspect of the invention, which may be combined with any previous or subsequent embodiment not in contradiction therewith, the coating is performed by a single of the predetermined portions of coating substance, in one or more shots of vapour. This results in consistent coatings.

In an embodiment of the method of the first aspect of the invention, which may be combined with any previous or subsequent embodiment not in contradiction therewith, the coating is performed by ejecting one or more than one time discrete shots of the result of the vaporising. Ejecting a single discrete shot of the coating substance vapour results in a coating on the substrate which is homogeneous through its thickness, whereas coating in multiple shots permits thicker coatings to be deposited.

In an embodiment of the method of the first aspect of the invention, which may be combined with any previous or subsequent embodiment not in contradiction therewith, a flow of gas is superimposed to the ejection of the coating substance vapour. This gas is preferably inert, e.g. nitrogen and/or argon. This superimposed gas flow helps to carry the vaporised coating substance into the vacuum recipient evenly and efficiently, resulting in high quality coatings. In a further embodiment, this superimposed gas flow is established in an uninterrupted manner at least during the coating.

In an embodiment of the method of the first aspect of the invention, which may be combined with any previous or subsequent embodiment not in contradiction therewith, the result of the vaporising is conveyed in a laminar flow of gas towards the ejecting. This gas is preferably an inert gas e.g. argon and/or nitrogen. This results in a smooth flow of the coating substance vapour towards the nozzle arrangement.

In an embodiment of the method of the first aspect of the invention, which may be combined with any previous or subsequent embodiment not in contradiction therewith, the result of the vaporising is expanded into the vacuum recipient. This expansion is preferably through a flow resistance element such as a flow channel element and/or a flow diffuser element such as a metal foam element, wire wool, one or more gauzes, and/or in a substantially laminar flow towards the expanding, and/or thereby performing pumping of the recipient at least during the coating. This likewise results in smoothly carrying the vaporised coating substance into the vacuum recipient.

In an embodiment of the method of the first aspect of the invention, which may be combined with any previous or subsequent embodiment not in contradiction therewith, the distillation of the precursor material so as to remove the solvent is carried out under reduced pressure and/or increased temperature, preferably at room temperature and reduced pressure, to prevent exposure of the precursor material and the coating substance to increased temperatures, which may cause it to degrade.

In an embodiment of the method of the first aspect of the invention, which may be combined with any previous or subsequent embodiment not in contradiction therewith, the ejecting is performed at least one of:
coaxially to an axis;
coaxially to an axis and comprising an ejection direction component radially outwards from the axis, this component being preferably the predominant component of direction of the ejecting;
in a ring-shaped ejection pattern about an axis.

In consequence, the vapour distribution and thus the coating distribution can be optimised.

In an embodiment of the method of the first aspect of the invention, which may be combined with any previous or subsequent embodiment not in contradiction therewith, the surface of the at least one substrate is pre-treated before coating, preferably by reactive ion etching and/or deposition of a transparent layer. The transparent layer is preferably at least one of $SiO_2$, SiN, $Al_2O_3$ and AlN. This pretreatment provides a clean, uniform, and smooth surface for the coating to be deposited upon, thereby improving coating quality and smoothness.

In an embodiment of the method of the first aspect of the invention, which may be combined with any previous or subsequent embodiment not in contradiction therewith, the vaporising is carried out in a vaporising compartment, and the result of the vaporising is ejected from the vaporising compartment. Thereby a pressure course is established in at least one of the vaporising compartment and the vacuum recipient, this pressure course rising to a maximum due to the vapour pressure of the vaporised coating substance and dropping by half of the value of the rise within at most 10 seconds from reaching the maximum, preferably within at most five seconds, even more preferably within a most one second. This enables fast vaporisation and commensurately fast coating. In a further embodiment, the pressure course drops by half of the value of the rise within at least 0.5 seconds.

In an embodiment of the method of the first aspect of the invention, which may be combined with any previous or subsequent embodiment not in contradiction therewith, the predetermined portion is provided to the vaporising within at most 30 ms, i.e. the predetermined portion of coating substance is injected quickly into the vaporising chamber.

In an embodiment of the method of the first aspect of the invention, which may be combined with any previous or subsequent embodiment not in contradiction therewith, a pressure dependent from a pressure generated due to the vaporising of the coating substance is sensed, and the result of this sensing is exploited for process monitoring and/or process control, preferably in a negative feedback control loop. The dependent pressure is preferably sensed in the vacuum recipient, and the result of vaporising is preferably fed to the recipient via a flow channel. Thus accurate process control is assured. Furthermore, a result of the vaporising is preferably fed to the recipient via a flow channel.

In an embodiment of the method of the first aspect of the invention, which may be combined with any previous or subsequent embodiment not in contradiction therewith, the arrangement of at least one substrate is maintained centralised with respect to the ejection opening arrangement of the vapour distribution nozzle arrangement during the coating. Thereby, an even coating distribution on the one or more substrates is assured.

In an embodiment of the method of the first aspect of the invention, which may be combined with any previous or subsequent embodiment not in contradiction therewith, further arrangements of at least one substrate are provided in the vacuum recipient at a rate of one arrangement every 20 seconds or less, preferably 10 seconds or less, even more preferably 5 seconds or less, giving a high rate of throughput of substrates in an in-line coating method.

In an embodiment of the method of the first aspect of the invention, which may be combined with any previous or subsequent embodiment not in contradiction therewith, the part of the result of the vaporising is heated before, and/or during, and/or after its ejection, before coating. This prevents the coating material from forming a coating on undesired parts of the vapour source.

An object the invention is likewise achieved by a method of manufacturing a portable device or the screen of a portable device which comprises manufacturing a screen of the portable device or the screen as a coated substrate according to any of the above-mentioned methods of the first aspect of the invention. Preferably, the screen is a touch-screen.

An object the invention is likewise attained in the first aspect of the invention by a coating apparatus. This coating apparatus comprises a reservoir for a liquid precursor material which latter comprises a coating substance dissolved in a solvent, and the reservoir comprises an output. A distillation unit is provided having a first input in operational connection with the output of the reservoir, having a first output the coating substance and the second output the solvent. A vaporising compartment is provided, this vaporising compartment having a second input and a third output.

The first output is operatively connected the second input via a controllable valve arrangement having a first control input, which is operationally connected to the first control input. A vapour distribution nozzle arrangement is provided, which comprises a distribution nozzle with a distribution opening arrangement in a vacuum recipient, the vapour distribution nozzle having a third input which is in operational connection with the third output. A substrate carrier is provided in the vacuum recipient, the substrate carrier being positionable opposite to the distribution opening arrangement of the vapour distribution nozzle.

In consequence of these features, since distillation of the precursor material can take place separate to the vaporisation of the precursor material in the separate distillation unit, substantially no solvent is present in the vacuum recipient during deposition, leading to improved coating evenness and coating quality. Furthermore, vaporising only a fraction of the result of the distillation enables faster deposition, since only sufficient precursor material need be evaporated for one or several "shots" of vapour, each shot being sufficient to deposit a coating of the desired thickness on the substrate or substrates present in the vacuum recipient at that time. In consequence, vaporisation of relatively large quantities of coating material at any one time is avoided in this apparatus, avoiding excessive exposure of the precursor material to relatively high heat prior to vaporisation, reducing deterioration of the coating substance and thus improving the coating quality.

In an embodiment of the apparatus of the first aspect of the invention, which may be combined with any subsequent embodiment not in contradiction therewith, a further controllable valve arrangement is provided, which has a second control input and is interconnected between the third output and the third input. The control unit has a second control output in operational connection with the second control input. This provides means to control the dosing of coating substance vapour from the vaporiser compartment into the vapour distribution nozzle arrangement.

In an embodiment of the apparatus of the first aspect of the invention, which may be combined with any previous or subsequent embodiment not in contradiction therewith, the control unit comprises a first controlled pulse generator for a signal to be applied to the first control input, thereby providing control means for dosing the coating substance into the vaporiser compartment. In a further embodiment, a valve opening pulse to the first control input last at most 30 msec, which enables the dose of coating substance to be injected quickly into the vaporising chamber.

In an embodiment of the apparatus of the first aspect of the invention, which may be combined with any previous or subsequent embodiment not in contradiction therewith, a further controllable valve arrangement is provided, which has a second control input and is interconnected between the third output and the third input. The control unit has a second control output operationally connected to the second control input, and comprises a second control pulse generator for a signal to be applied to the second control input. Thus, both of the controllable valve arrangements can be controlled as desired by the process operator. In a further embodiment, the control unit generates pulses to the second control input with a pulse repetition frequency at least equal to a pulse repetition frequency of pulses generated to the first control input, these two pulses being synchronised.

In an embodiment of the apparatus of the first aspect of the invention, which may be combined with any previous or subsequent embodiment not in contradiction therewith, the apparatus comprises at least one carrier gas supply line in operational connection with a gas reservoir. The one or more gas supply line(s) is/are arranged to discharge gas at at least one of the following locations:

upstream of the distillation unit, e.g. to supply gas pressure to force precursor material into the distillation unit;

in the distillation unit, e.g. to supply gas pressure to force the recovered coating material out of the distillation unit;

between the first output and the second input, e.g. to supply gas pressure to force the coating substance into the vaporiser compartment;

in the vaporiser compartment, e.g. to supply carrier gas to carry the vaporised coating substance through and out of the vaporiser compartment;

between the third output and the third input, e.g. to supply carrier gas to carry the vaporised coating substance from the vaporising compartment to the vapour distribution nozzle;

in the vapour distribution nozzle, e.g. to supply carrier gas to carry the vaporised coating substance through the vapour distribution nozzle;

upstream of a flow resistance element which is preferably a flow channel arrangement or a flow diffuser element interconnected between the distribution opening arrangement and the third output, e.g. to supply carrier gas to carry the vaporised coating substance from the third output to the distribution opening arrangement.

In an embodiment of the apparatus of the first aspect of the invention, which may be combined with any previous or subsequent embodiment not in contradiction therewith, at least one flow resistance element is provided, which is preferably a flow channel arrangement or a flow diffuser element interconnected between the third output and the distribution opening arrangement. Thereby, optimised vapour flow is achieved.

In an embodiment of the apparatus of the first aspect of the invention, which may be combined with any previous or subsequent embodiment not in contradiction therewith, the control unit comprises a control pulse generator for a signal applied to the first control input. The substrate carrier is positionable in the vacuum recipient by a controllable drive, operation of which is synchronised with the generation of pulses to the first control input. Preferably, more than one of the substrate carriers are provided and are arranged to be subsequently positioned at a frequency equal to the pulse repetition frequency of the pulses generated at the first control input, resulting in one "shot" of coating substance per substrate arrangement in in-line operation, or the frequency of the pulses is an integer multiple of the frequency of positioning of the substrate carriers, resulting in multiple "shots" of coating substance per substrate arrangement in in-line operation.

In an embodiment of the apparatus of the first aspect of the invention, which may be combined with any previous or subsequent embodiment not in contradiction therewith, the distribution opening arrangement comprises at least one opening arranged according to at least one of:
  coaxially to an axis;
  coaxially to an axis and comprising opening axes direction radially outwards from the axis;
  so as to generate a ring-shaped ejection pattern about an axis.

Thereby, an optimal vapour distribution over the arrangement of substrates can be achieved.

In an embodiment of the apparatus of the first aspect of the invention, which may be combined with any previous or subsequent embodiment not in contradiction therewith, the substrate carrier has a surface arranged to face the opening arrangement, this surface having at least one indentation for receiving a substrate. Thereby, substrates can be supported by the substrate carrier.

In an embodiment of the apparatus of the first aspect of the invention, which may be combined with any previous or subsequent embodiment not in contradiction therewith, the apparatus comprises more than one substrate carrier, the substrate carriers being controllably movable by a controlled drive. This controlled drive is arranged to be controlled so as to subsequently position one of the carriers after the other opposite the distribution opening arrangement at a rate of at least one carrier per 20 seconds, preferably at least one per 10 seconds, even more preferably at least one per 5 seconds. Thus, high-speed in-line coating of substrates can be achieved.

In an embodiment of the apparatus of the first aspect of the invention, which may be combined with any previous or subsequent embodiment not in contradiction therewith, the recipient is operationally connected to a controlled vacuum pump being arranged to be controlled to operate at least during establishment of a flow connection between the third output and the third input.

In an embodiment of the apparatus of the first aspect of the invention, which may be combined with any previous or subsequent embodiment not in contradiction therewith, the apparatus comprises a heating arrangement between the output of the vaporiser compartment and area wherein the ejection opening arrangement opens into the vacuum recipient, preferably in said area. Thus deposition of the coating substance on parts of the coating apparatus is avoided by maintaining them as sufficient temperature to prevent such deposition.

The object of the invention is likewise attained in its first aspect by an apparatus according to any of the apparatus embodiments as described above adapted to be operated according to any of the method embodiments as described above. It is likewise attained by a method according to any of the method embodiments as described above performed by an apparatus according to any of the apparatus embodiments described above.

Second Aspect of the Invention

An object of the invention is attained in a second aspect of the invention by a method of manufacturing a coated substrate. In this method, vapour distribution nozzle arrangement is provided in a vacuum recipient, this vapour distribution nozzle arrangement comprising a vapour ejection opening arrangement, and an arrangement of at least one substrate is provided in the vacuum recipient. The vacuum recipient is then evacuated at the latest when the substrate arrangement is provided therein: of course, the vacuum recipient can be maintained constantly under vacuum. A vaporising compartment is provided, which is heated. A predetermined portion of a liquid precursor material, which comprises a coating substance dissolved in a solvent, is injected into the vaporising compartment, where it is vaporised by the heating, thereby causing a rise in pressure in at least one of the vaporising compartment and the vacuum recipient due to the vapour pressure of the solvent and/or coating substance of the liquid precursor material. A result of this vaporising of the predetermined portion of liquid precursor material, i.e. the vapour produced thereby, is ejected through the vapour distribution opening arrangement into the vacuum recipient. A pressure course is established, e.g. by vacuum pumping, in at least one of the vaporising compartment and the vacuum recipient which rises to a maximum due to the vaporising and dropping by half of the value of the rise in the respective one of the vaporising compartment and the vacuum recipient within at most 10 seconds from reaching the maximum, preferably within at most 5 seconds, more preferably within at most 1 second. A coating of the coating substance on the arrangement of at least one substrate is established, and the arrangement of at least one substrate is removed from the vacuum recipient after coating.

Thereby, a "shot" of liquid precursor material is rapidly vaporised and then rapidly establishes a coating on the substrate or substrates. Since the precursor material retains its solvent, which serves to stabilise the coating substance, up to the point of vaporization and is rapidly vaporised, the coating substance is not exposed to relatively high temperatures for relatively long periods of time, hence deterioration of the coating substance is minimised, and the quality of the coating on the substrate or substrates is improved.

In an embodiment of the method of the second aspect of the invention which may be combined with any subsequent embodiment not in contradiction therewith, the result of the vaporising is ejected in a single shot, which leads to high quality coatings which are homogenous through their thickness, and simplifies the method by eliminating any requirement for storage of vapour. In an alternative embodiment, the result of the vaporising is ejected in more than one time-discrete shots. Thus, the predetermined portion of coating substance vaporised is sufficient for several coating shots, and this vapour is held ready and released in several discrete shots. This is particularly advantageous in the case of application of a multi-layer coating.

In an embodiment of the method of the second aspect of the invention which may be combined with any previous or subsequent embodiment not in contradiction therewith, the coating is performed by a single or by more than one of the predetermined portions. In the case of a single predetermined portion, coatings which are extremely homogeneous through their thickness are produced, whereas in the case of more than one predetermined portions, thicker coatings can be produced.

In an embodiment of the method of the second aspect of the invention which may be combined with any previous or subsequent embodiment not in contradiction therewith, the coating is performed by ejecting one or more than one time discrete shots out of the result of the vaporising. In the case of a single discrete shot, coatings which are extremely homogeneous through their thickness are produced, whereas in the case of more than one discrete shots, thicker coatings can be produced.

In an embodiment of the method of the second aspect of the invention, which may be combined with any previous or subsequent embodiment not in contradiction therewith, a flow of gas is superimposed to the ejection of the coating substance vapour. This gas is preferably inert, e.g. nitrogen and/or argon. This superimposed gas flow helps to carry the vaporised coating substance into the vacuum recipient evenly and efficiently, resulting in high quality coatings. In a further embodiment, this superimposed gas flow is established in an uninterrupted manner at least during the coating.

In an embodiment of the method of the second aspect of the invention, which may be combined with any previous or subsequent embodiment not in contradiction therewith, the result of the vaporising is conveyed in a laminar flow of gas towards the ejecting. This gas is preferably an inert gas e.g. argon and/or nitrogen. This results in a smooth flow of the coating substance vapour towards the nozzle arrangement.

In an embodiment of the method of the second aspect of the invention, which may be combined with any previous or subsequent embodiment not in contradiction therewith, the result of the vaporising is expanded into the vacuum recipient. This expansion is preferably through a flow resistance element such as a flow channel element or a flow diffuser element such as a metal foam element, wire wool, one or more gauzes, and/or in a substantially laminar flow towards the expanding, and/or thereby performing pumping of the recipient at least during the coating. This likewise results in smoothly carrying the vaporised coating substance into the vacuum recipient.

In an embodiment of the method of the second aspect of the invention, which may be combined with any previous or subsequent embodiment not in contradiction therewith, the ejecting is performed at least one of:

coaxially to an axis;

coaxially to an axis and comprising an ejection direction component radially outwards from the axis, this component being preferably the predominant component of direction of the ejecting;

inner ring-shaped ejection pattern about an axis.

In consequence, the vapour distribution and thus the coating distribution can be optimised.

In an embodiment of the method of the second aspect of the invention, which may be combined with any previous or subsequent embodiment not in contradiction therewith, the surface of the at least one substrate is pre-treated before coating, preferably by reactive ion etching and/or deposition of a transparent layer. The transparent layer is preferably at least one of $SiO_2$, SiN, $Al_2O_3$ and AlN. This pretreatment provides a clean, uniform, and smooth surface for the coating to be deposited upon, thereby improving coating quality and smoothness.

In an embodiment of the method of the second aspect of the invention, which may be combined with any previous or subsequent embodiment not in contradiction therewith, the vaporising is carried out in a vaporising compartment, and the result of the vaporising is ejected from the vaporising compartment. Thereby a pressure course is established in at least one of the vaporising compartment and the vacuum recipient, this pressure course rising to a maximum due to the vapour pressure of the vaporised coating substance and dropping by half of the value of the rise within at least 0.5 seconds.

In an embodiment of the method of the second aspect of the invention, which may be combined with any previous or subsequent embodiment not in contradiction therewith, the predetermined portion of precursor material is selected have a volume of between $5 \times 10^{-5}$ and $5 \times 10^{-2}$ microliters per square centimeter of substrate area to be coated, preferably between $15 \times 10^{-3}$ and $36 \times 10^{-3}$ microliters per square centimeter of substrate area to be coated. These values have proven to provide excellent coating properties in practice.

In an embodiment of the method of the second aspect of the invention, which may be combined with any previous or subsequent embodiment not in contradiction therewith, the predetermined portion is provided to the vaporising within at most 30 ms, i.e. the predetermined portion of coating substance is injected quickly into the vaporising chamber.

In an embodiment of the method of the second aspect of the invention, which may be combined with any previous or subsequent embodiment not in contradiction therewith, a pressure dependent from a pressure generated in the vaporising compartment, i.e. due to the vapour pressure of the vaporized solvent and vapourised coating substance is sensed, and the result of this sensing is exploited for process monitoring and/or process control, preferably in a negative feedback control loop. The dependent pressure is preferably sensed in the vacuum recipient, and the result of vaporising is preferably fed to the recipient via a flow resistance element, preferably a flow channel and/or a flow diffuser element such as a metal foam element, wire wool, gauzes, etc. Thus accurate process control is assured.

In an embodiment of the method of the second aspect of the invention, which may be combined with any previous or subsequent embodiment not in contradiction therewith, the arrangement of at least one substrate is maintained centralised with respect to the ejection opening arrangement of the vapour distribution nozzle arrangement during the coating. Thereby, an even coating distribution on the one or more substrates is assured.

In an embodiment of the method of the second aspect of the invention, which may be combined with any previous or subsequent embodiment not in contradiction therewith, further arrangements of at least one substrate are provided in the vacuum recipient at a rate of one arrangement every 20 seconds or less, preferably 10 seconds or less, even more preferably 5 seconds or less, giving a high rate of throughput of substrates in an in-line coating method.

In an embodiment of the method of the second aspect of the invention, which may be combined with any previous or subsequent embodiment not in contradiction therewith, the part of the result of the vaporising is heated before, and/or during, and/or after its ejection, before coating. This prevents the coating material from forming a coating on undesired parts of the vapour source.

In an embodiment of the method of the second aspect of the invention, which may be combined with any previous or subsequent embodiment not in contradiction therewith, the method comprises flow communication between the vaporising and the vacuum recipient during the vaporising via at least one flow resistance element, preferably a flow channel arrangement or a flow diffuser element, such as a porous elements such as a metal foam element. Thus homogeneous flow of vapour is generated, leading to excellent quality homogeneous coatings.

In an embodiment of the method of the second aspect of the invention, which may be combined with any previous or subsequent embodiment not in contradiction therewith, the method comprises providing vapour distribution nozzle arrangement in a vacuum recipient, this vapour distribution nozzle arrangement comprising a vapour ejection opening arrangement, and arrangement of at least one substrate is provided in the vacuum recipient. The vacuum recipient is then evacuated at the latest when the substrate arrangement is provided therein: of course, the vacuum recipient can be maintained constantly under vacuum. A vaporising compartment is provided, which is heated. A predetermined portion of a liquid precursor material, which comprises a coating substance dissolved in a solvent, is injected into the vaporising compartment, where it is vaporised by the heating, thereby causing a rise in pressure in at least one of the vaporising compartment and the vacuum recipient due to the vapour pressure of the solvent and/or coating substance of the liquid precursor material. A result of this vaporising of the predetermined portion of liquid precursor material, i.e. the vapour produced thereby, is ejected through the vapour distribution opening arrangement into the vacuum recipient. A step or steps, as appropriate, of one or more of the further embodiments of the method of the second aspect are then carried out. A coating of the coating substance on the arrangement of at least one substrate is established, and the arrangement of at least one substrate is removed from the vacuum recipient after coating. In consequence, extremely high quality coatings are produced on the substrate or substrates.

An object the invention is likewise attained by a method of manufacturing a portable device or the screen of a portable device which comprises manufacturing a screen of the portable device or the screen as a coated substrate according to any of the above-mentioned methods of the second aspect of the invention. Preferably, the screen is a touchscreen.

An object of the present invention is likewise attained by a coating apparatus of the second aspect of the invention, this coating apparatus comprising the vacuum recipient, a reservoir for a liquid precursor material which liquid precursor material comprises a coating substance and the solvent, the reservoir having an output, and the vaporiser compartment having a first input and a first output. The output of the reservoir is operatively connected to the first input via a controllable valve arrangement having a first control input. A control unit having a first control output is operationally connected to the first control input. A vapour distribution nozzle arrangement comprising a distribution nozzle with an opening arrangement in the vacuum recipient is provided, which has a second input in operational connection with the first output. At least one flow resistance element is interconnected between the opening arrangement and the first output. A substrate carrier is provided in the vacuum recipient, the substrate carrier being positionable opposite the opening arrangement. In consequence, a coating apparatus is provided which is capable of very rapidly depositing high-quality, homogeneous coatings on substrates, at least partially due to the fact that the apparatus permits the precursor material to retains its solvent, which serves to stabilise the coating substance, up to the point of vaporization, at which point it is rapidly vaporized. As a result, the coating substance is not exposed to relatively high temperatures for relatively long periods of time, hence deterioration of the coating substance is minimised, and the quality of the coating on the substrate or substrates is improved.

In an embodiment of the apparatus of the second aspect of the invention, which may be combined with any subsequent embodiment not in contradiction therewith, the vaporiser compartment has a volume of between 0.005 $cm^3$ and 0.035 $cm^3$ per square centimeter of substrate carrier to be coated, preferably between 0.015 $cm^3$ and 0.025 $cm^3$ per square centimeter of substrate carrier to be coated. These values have been shown in practice to give excellent results.

In an embodiment of the apparatus of the second aspect of the invention, which may be combined with any previous or subsequent embodiment not in contradiction therewith, the flow resistance element is at least one of at least one flow channel, i.e. a tube, pipe, spider flange or similar, and a flow diffuser element preferably realised by at least one of a porous ceramic element, a porous metal element (such as wire wool or one or more gauzes), a metal foam element, or similar.

In an embodiment of the apparatus of the second aspect of the invention, which may be combined with any previous or subsequent embodiment not in contradiction therewith, the further controllable valve arrangement has a second control input and is interconnected between the first output and the second input. Furthermore, the control unit has a second control output operationally connected to the second control input. This provides means to control the dosing of coating substance vapour from the vaporiser compartment into the vapour distribution nozzle arrangement.

In an embodiment of the apparatus of the second aspect of the invention, which may be combined with any previous or subsequent embodiment not in contradiction therewith, the control unit comprises a first controlled pulse generator for a signal to be applied to the first control input, thereby providing control means for dosing the coating substance into the vaporiser compartment. In a further embodiment, a valve opening pulse to the first control input last at most 30 msec, which enables the dose of coating substance to be injected quickly into the vaporising chamber.

In an embodiment of the apparatus of the second aspect of the invention, which may be combined with any previous or subsequent embodiment not in contradiction therewith, a further controllable valve arrangement is provided, which has a second control input and is interconnected between the third output and the third input. The control unit has a second control output operationally connected to the second control input, and comprises a second control pulse generator for a signal to be applied to the second control input. Thus, both of the controllable valve arrangements can be controlled as desired by the process operator. In a further embodiment, the control unit generates pulses to the second control input with a pulse repetition frequency at least equal to a pulse repetition frequency of pulses generated to the first control input, these two pulses being synchronised.

In an embodiment of the apparatus of the second aspect of the invention, which may be combined with any previous or subsequent embodiment not in contradiction therewith, the apparatus comprises at least one carrier gas supply line in operational connection with a gas reservoir. The one or more gas supply line(s) is/are arranged to discharge gas at at least one of the following locations:
  upstream of the distillation unit, e.g. to supply gas pressure to force precursor material into the distillation unit;
  in the distillation unit, e.g. to supply gas pressure to force the recovered coating material out of the distillation unit;
  between the first output and the second input, e.g. to supply gas pressure to force the coating substance into the vaporiser compartment;
  in the vaporiser compartment, e.g. to supply carrier gas to carry the vaporised coating substance through and out of the vaporiser compartment;
  between the third output and the third input, e.g. to supply carrier gas to carry the vaporised coating substance from the vaporising compartment to the vapour distribution nozzle;
  in the vapour distribution nozzle, e.g. to supply carrier gas to carry the vaporised coating substance through the vapour distribution nozzle;
  upstream of a flow resistance element which is preferably a flow channel arrangement or a flow diffuser element interconnected between the distribution opening arrangement and the third output, e.g. to supply carrier gas to carry the vaporised coating substance from the third output to the distribution opening arrangement.

In an embodiment of the apparatus of the second aspect of the invention, which may be combined with any previous or subsequent embodiment not in contradiction therewith, the control unit comprises a control pulse generator for a signal applied to the first control input. The substrate carrier is positionable in the vacuum recipient by a controllable drive, operation of which is synchronised with the generation of pulses to the first control input. Preferably, more than one of the substrate carriers are provided and are arranged to be subsequently positioned at a frequency equal to the pulse repetition frequency of the pulses generated at the first control input, resulting in one "shot" of coating substance per substrate arrangement in in-line operation, or the frequency of the pulses is an integer multiple of the frequency of positioning of the substrate carriers, resulting in multiple "shots" of coating substance per substrate arrangement in in-line operation.

In an embodiment of the apparatus of the second aspect of the invention, which may be combined with any previous or subsequent embodiment not in contradiction therewith, the distribution opening arrangement comprises at least one opening arranged according to at least one of:

- coaxially to an axis;
- coaxially to an axis and comprising opening axes direction radially outwards from the axis;
- so as to generate a ring-shaped ejection pattern about an axis.

Thereby, an optimal vapour distribution over the arrangement of substrates can be achieved.

In an embodiment of the apparatus of the second aspect of the invention, which may be combined with any previous or subsequent embodiment not in contradiction therewith, the substrate carrier has a surface arranged to face the opening arrangement, this surface having at least one indentation for receiving a substrate. Thereby, substrates can be supported by the substrate carrier.

In an embodiment of the apparatus of the second aspect of the invention, which may be combined with any previous or subsequent embodiment not in contradiction therewith, the apparatus comprises more than one substrate carrier, the substrate carriers being controllably movable by a controlled drive. This controlled drive is arranged to be controlled so as to subsequently position one of the carriers after the other opposite the distribution opening arrangement at a rate of at least one carrier per 20 seconds, preferably at least one per 10 seconds, even more preferably at least one per 5 seconds. Thus, high-speed in-line coating of substrates can be achieved.

In an embodiment of the apparatus of the second aspect of the invention, which may be combined with any previous or subsequent embodiment not in contradiction therewith, the recipient is operationally connected to a controlled vacuum pump being arranged to be controlled to operate at least during establishment of a flow connection between the first output and the second input.

In an embodiment of the apparatus of the second aspect of the invention, which may be combined with any previous or subsequent embodiment not in contradiction therewith, the apparatus comprises a heating arrangement between the output of the vaporiser compartment and the area wherein the ejection opening arrangement opens into the vacuum recipient, preferably in said area. Thus deposition of the coating substance on parts of the coating apparatus is avoided by maintaining them as sufficient temperature to prevent such deposition.

The object of the invention is likewise attained in its second aspect by an apparatus according to any of the apparatus embodiments of the second aspect as described above adapted to be operated according to any of the method embodiments of the second aspect as described above. It is likewise attained by a method according to any of the method embodiments of the second aspect as described above performed by an apparatus according to any of the embodiments of the second aspect.

Third Aspect of the Invention

An object of the invention is attained in a third aspect of the invention by a vapour distribution nozzle arrangement comprising a distribution element with an input for vapour and an output vapour, the distribution element comprising a recess that becomes enlarged in the direction of the output, with the input situated at the apex, or peak, of the recess, i.e. at its narrowest part. A deflection element is provided for directing vapour from the input for vapour towards the walls of the recess. This deflection element comprises a single deflection surface facing the input for vapour. By this single deflection surface, by which we understand an essentially unbroken deflection surface (broken only with its support structure if required) as opposed to for instance a shower-head-type arrangement or as opposed to a deflection element comprising a plurality of bores or holes directed towards the walls of the recess, a particularly even distribution of vapour is deflected onto the walls of the recess, resulting in a particularly homogeneous distribution of vapour at the output for vapour, such that a substrate positioned in a vacuum recipient facing the output for vapour is coated with a particularly homogeneous coating resulting from the vapour. Thus the quality of such a coating can be substantially improved by use of such a vapour distribution nozzle arrangement. Furthermore, this vapour distribution nozzle arrangement permits high-speed deposition of such coatings.

In an embodiment of the vapour distribution nozzle arrangement, which may be combined with any subsequent embodiment not in contradiction therewith, the deflection element is thermally coupled to the distribution element, ensuring that the deflection element is as near as possible to the temperature of the deflection element, preventing undesired deposition of vapour onto the deflection element which might render the vapour distribution less homogeneous.

In an embodiment of the vapour distribution nozzle arrangement, which may be combined with any previous or subsequent embodiment not in contradiction therewith, the deflection element comprises a disc with a raised central portion and/or a raised edge portion extending from the plane of the disc towards the input for vapour. These features deflect the vapour in an efficient manner towards the walls of the recess, resulting in a particularly homogeneous vapour distribution at the output for vapour. In a further embodiment thereof, the raised central portion is described by a surface of rotation of the concave curve, leading to a "circus tent"-form, which has been shown to be particularly effective in practice.

In an embodiment of the vapour distribution nozzle arrangement, which may be combined with any previous or subsequent embodiment not in contradiction therewith, the recess is conical-shaped or pyramidal shaped, providing optimal vapour distribution for circular and square/rectangular substrates respectively.

In an embodiment of the vapour distribution nozzle arrangement, which may be combined with any previous or subsequent embodiment not in contradiction therewith, the distribution element is provided with at least one heating element, permitting heating of the distribution element to prevent undesired deposition/condensation of vapour thereupon, which undesired deposition might reduce the homogeneity of the vapour distribution at the output vapour.

An object of the present invention is likewise attained in its third aspect by a vapour source comprising a vapour distribution nozzle arrangement according to any of the above vapour distribution nozzle embodiments, and the vaporiser compartment inoperative connection with the input for vapour, this vaporiser compartment comprising a vapour chamber. The advantageous vapour nozzle is thus integrated into a vapour source, for generating particularly homogeneous distributions of vapour, e.g. for coating purposes.

In an embodiment of the vapour source, which may be combined with any subsequent embodiment not in contradiction therewith, the vaporising compartment comprises at least one diffuser element proximate to the input for vapour of the distribution nozzle arrangement, this diffuser element being preferably of metal foam. Alternatively, the diffuser element may be wire wool, one or more gauzes, or similar. This diffuser element results in a smooth and even flow distribution of vapour into the input for vapour, which helps to ensure a homogeneous distribution of vapour at the output for vapour.

In an embodiment of the vapour source, which may be combined with any previous or subsequent embodiment not in contradiction therewith, the vapour source further comprises an injection lance for injecting a predetermined dose of a liquid material into the vaporising compartment, the injection lance opening into the compartment upstream of the vapour distribution nozzle arrangement. Thus, liquid material can be injected into the vaporising compartment so as to be vaporised and thereby produce vapour to be distributed by the vapour distribution arrangement. In a further embodiment, an annular diffuser element is disposed between the walls of the injection lance and the walls of the vaporising compartment. This annular diffuser element is preferably made of metal foam, however as above, may also be wire wool, one or more gauzes, or similar, or any combination thereof. This further assists in ensuring smooth and even flow of vapour in the vaporising compartment.

In an embodiment of the vapour source, which may be combined with any previous or subsequent embodiment not in contradiction therewith, a carrier gas input to the vaporising compartment is provided, thereby permitting a carrier gas for carrying vapour out of the vaporising compartment and into the vapour distribution nozzle arrangement can be supplied.

In an embodiment of the vapour source, which may be combined with any previous or subsequent embodiment not in contradiction therewith, the source comprises a further diffuser element and carrier gas input upstream of said further diffuser element, enabling introduction of carrier gas into the source for carrying vapour out of the vaporising compartment and into the vapour distribution arrangement. This further diffuser element ensures that the flow of carrier gas is as homogeneous as possible, ensuring that the resulting vapour distribution at the output for vapour is likewise as homogeneous as possible.

In an embodiment of the vapour source, which may be combined with any previous or subsequent embodiment not in contradiction therewith, the source comprises a vaporising chamber, a first wall of which is constituted by a first diffuser element, and a second wall of which, which is preferably opposite the first wall, is constituted by a second diffuser element. Both diffuser elements are preferably of metal foam, however above comments in respect of alternative materials apply equally here. An injection lance for injecting a predetermined dose of the liquid material into the vaporising chamber traverses the second diffuser element, and opens into the chamber. A carrier gas line is situated around the injection lance, and is terminated at one end by the second diffuser element. A gas input is provided at the other end of the carrier gas line. The first diffuser element is disposed between the chamber and the deflection element of the vapour distribution nozzle arrangement. This arrangement has been shown in practice to produce exceptionally homogeneous vapour distributions at the output for vapour: the particular arrangement of injection lance and diffuser elements results in a particularly homogeneous flow of carrier gas and vapour within the vapour source, which results in particularly homogeneous coatings being applied to substrates situated in a vacuum recipient opposite the output for vapour.

An object of the invention is likewise attained in respect of its third aspect by a method of distributing vapour comprising applying vapour to the input of a vapour distribution nozzle arrangement according to any of the vapour distribution nozzle embodiments above. This results in a particularly even and homogeneous vapour distribution being produced at the output for vapour of the paper distribution nozzle arrangement.

In an embodiment of the method of distributing vapour, the vapour distribution nozzle arrangement forms part of a vapour source according to any of the above vapour source embodiments, in which the vapour is generated by applying a liquid precursor material comprising a coating material dissolved in a solvent into the vaporising compartment. Thereby, this method produces particularly homogeneous distributions of coating material vapour based on a precursor material which is liquid.

An object of the invention is likewise attained by a an embodiment of a method of coating a substrate of the first aspect of the invention or of the second aspect of the invention, wherein the vaporising and ejecting of the result of the vaporising comprise a method of distributing vapour according to one of the above methods of distributing vapour.

An object of the invention is likewise attained by a coating apparatus according to an embodiment of the vapour coating apparatus of the first aspect of the invention or the second aspect of the invention, comprising a vapour distribution nozzle arrangement according to one of the above vapour distribution nozzle embodiments.

Finally, an object of the invention is likewise attained by a coating apparatus according to an embodiment of the vapour coating apparatus of the first aspect of the invention or the second aspect of the invention, comprising a vapour source according to one of the above vapour source embodiments.

BRIEF DESCRIPTION OF THE DRAWINGS

The present invention under all its aspects shall now be further described and exemplified with the help of figures. The figures show.

DETAILED DESCRIPTION

First Aspect: Pre-distillation

Figure 1:
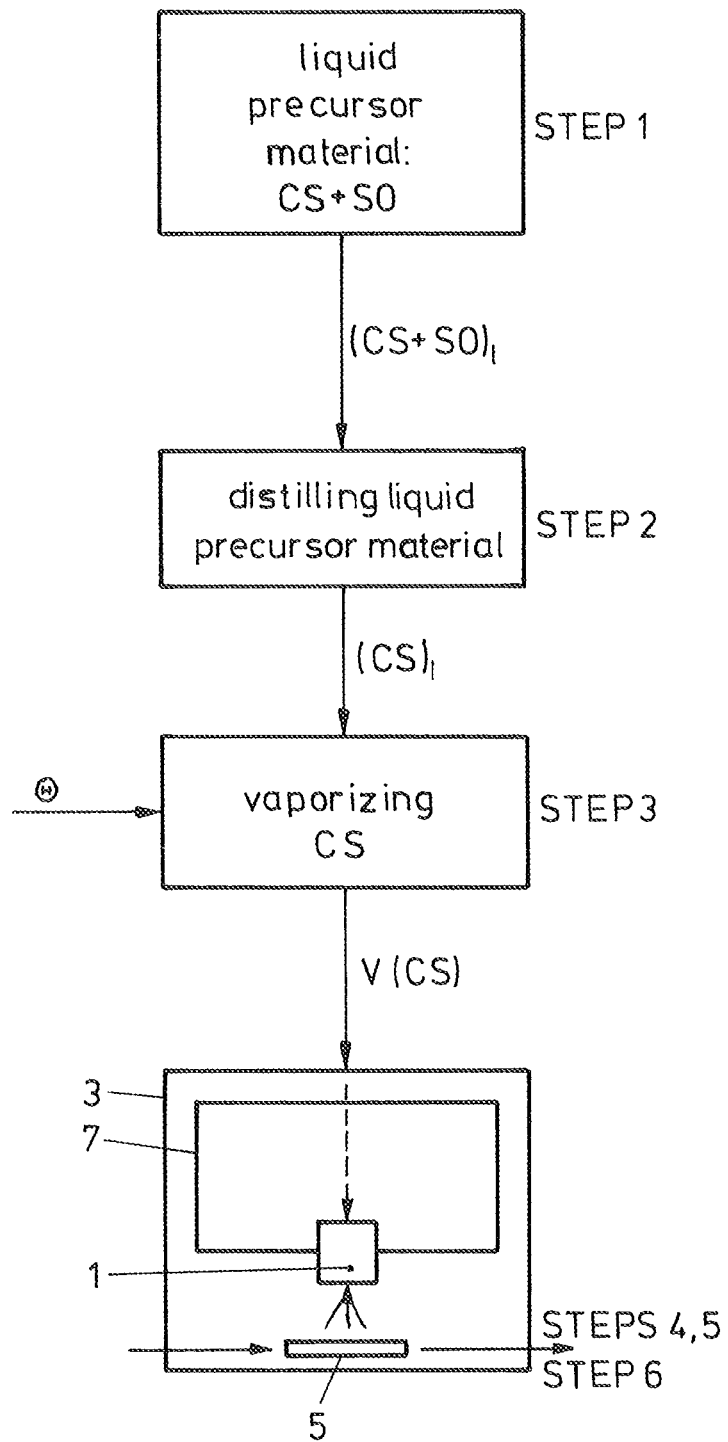
FIG. 1 a flow-chart/functional block diagram of the method according to the first aspect of the present invention and addressing operation of an apparatus according to that aspect of the invention, FIG. 2 a simplified signal-flow/functional block diagram of an apparatus according to the present invention under its first aspect and operated according to the method of the present invention under the addressed first aspect, FIG. 3 qualitatively a pressure vs. time course established in one variant in a vaporizer compartment and/or in a vacuum recipient for coating substrates of the invention under its first aspect, FIG. 4 schematically, three variants of opening arrangements as applied by the present invention under its first and second aspects to eject vapour towards substrates to be coated, FIG. 5 in a simplified perspective view, an embodiment of a substrate carrier for substrates to be coated according to the present invention in its first and second aspects, FIG. 6 in a more detailed, still simplified representation, a functional block diagram of an apparatus embodiment according to the first aspect of the invention, FIG. 7 in a representation in analogy to that of FIG. 1 a flow-chart/functional block diagram addressing the method according to the present invention under its second aspect and operation of an apparatus according to the present invention under the addressed aspect, FIG. 8 in a representation in analogy to that of FIG. 2, a simplified signal-flow/functional block diagram of an apparatus according to the invention under its second aspect and operating the method according to the invention under the addressed second aspect, FIG. 9 in a representation in analogy to that of FIG. 3, a pressure vs. time course as established in a vaporizer compartment and/or a vacuum recipient for coating substrates of the method and apparatus according to the invention under its second aspect, FIG. 10 schematically, three variants of realizing a flow resistance element for the invention according to all its aspects, FIG. 11 in a representation in analogy to that of FIG. 6, a simplified functional block diagram of an apparatus embodiment according to the invention under its second aspect and operating the method according to the invention under the addressed aspect, FIG. 12 a top view and a cross-sectional representation along line B-B of the top view of a vapour distribution nozzle arrangement according to the third aspect of the present invention and as advantageously exploited in combination with an apparatus according to invention's first and second aspects, FIG. 13 three variants of a reflection element as applicable to the vapour distribution nozzle arrangement as of FIG. 12 under the third aspect of the present invention and also to the apparatus and method of the invention according its first and second aspects, FIG. 14 in a representation in analogy to that of FIG. 12, a further embodiment of a vapour distribution nozzle arrangement under the third aspect of the invention and as applicable to the apparatus and in the frame of the method according to the invention under its first and second aspects, FIGS. 15 to 18
four embodiments of vapour distribution nozzle arrangements and vaporizer compartments forming in combination a vapour source, as of the present invention under its third aspect and as also applicable to the apparatus and in the frame of the method according to the present invention's first and second aspects, FIG. 19 in a simplified cross-sectional representation a vapour distribution nozzle arrangement and vaporizer compartment forming, in combination, a vapour source as of the third aspect of the present invention, advantageously also applied to the apparatus and method of the present invention according its first and second aspects.

FIG. 1 shows generically a functional block/flow-chart representation of a method according to the principle of the first embodiment of the invention.

In STEP1 liquid precursor material which comprises, to at least a major part, a coating substance CS and a solvent SO is provided in a reservoir. The liquid precursor material $(CS+SO)_l$ is distilled, STEP2, and, as a result, the liquid coating substance CS is recovered. A predetermined portion of the distilling result, thus at least predominantly liquid coating substance CS, is then thermally vaporized by loading the liquid coating substance CS by heat $\Theta$ in vaporizing STEP3. At least a part of the result of such vaporizing, in FIG. 1 addressed by V(CS), is ejected—STEP4—through an opening arrangement 1 into a vacuum recipient 3. Therein, an arrangement of at least one substrate 5 is coated, STEP 5. The opening arrangement 1 is provided at a nozzle arrangement 7. The substrate arrangement is removed—STEP6—from vacuum recipient 3 after having been coated by the addressed ejecting of at least a part of a predetermined portion of coating substance which has been vaporized in the vaporizing STEP3.

The predetermined portion which is vaporized in vaporizing STEP3 may be only a part of the result of distilling the liquid precursor material—STEP2—and only a part of the amount of coating material vaporized in the vaporizing STEP3 may be ejected through the ejection opening arrangement 1 at a time.

Figure 2:
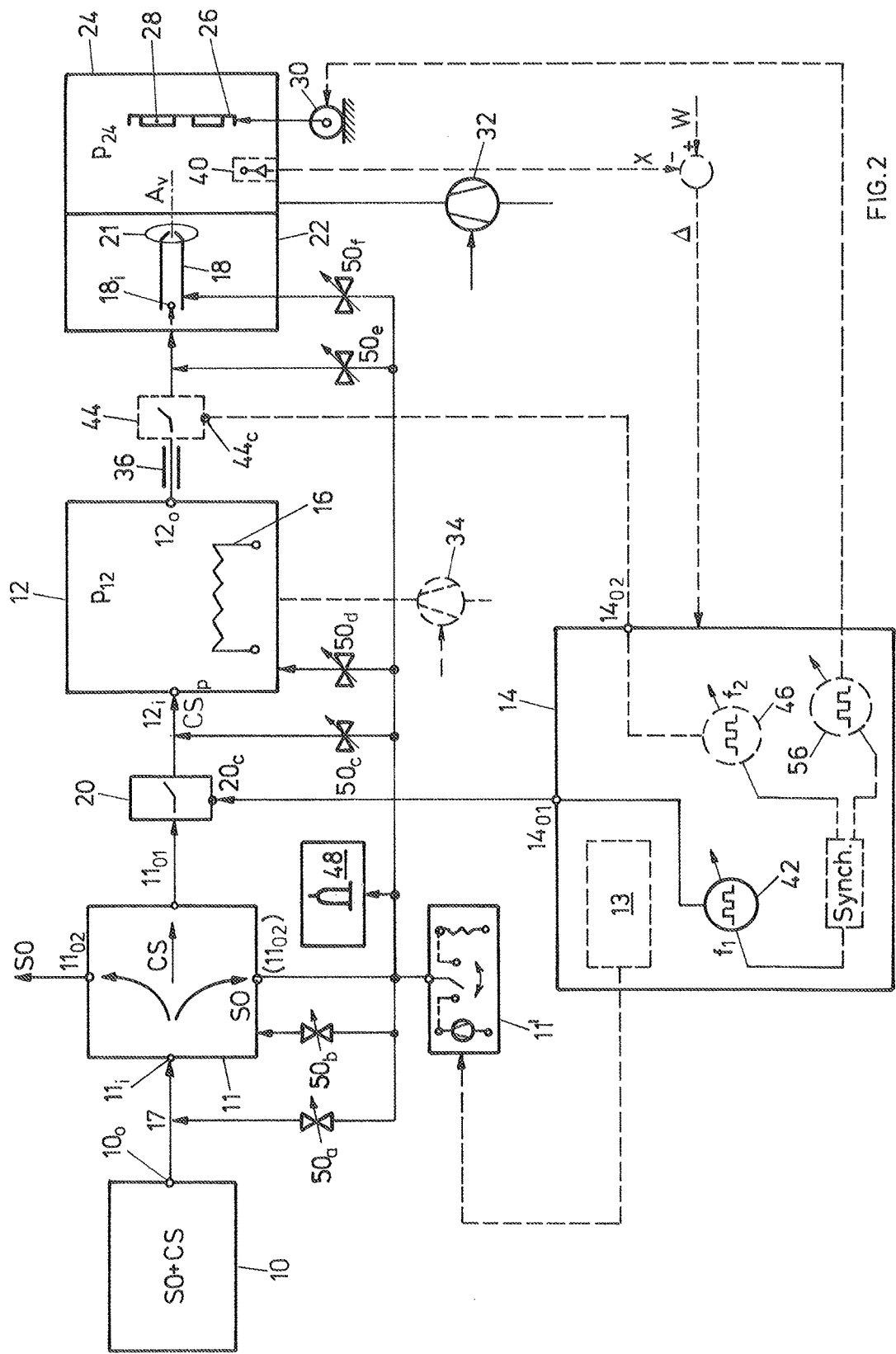

FIG. 2 shows a simplified and schematic signal flow/functional block diagram of an apparatus according to the first aspect of the invention and performing the method of manufacturing a coated substrate as was addressed in context with FIG. 1.

STEP1: Filling Reservoir with Precursor Material.

The apparatus is equipped with a reservoir tank 10 for the liquid precursor material as of STEP1 of FIG. 1. The capacity of the reservoir tank 10 is ideally sufficient to provide coating substance for one to two weeks of continuous substrate manufacturing. Thus e.g. simultaneously with a preventive maintenance of the apparatus or of equipment possibly provided to pre-treat a substrate to be fed into the vacuum recipient 3 of the equipment, of the apparatus or equipment for the coating according to the invention, and possibly provided apparatus or equipment, for post-treatment of coated substrates, reservoir tank 10 is filled or refilled with a full charge of precursor material. Reservoir tank 10, also addressed throughout the present description and claims as reservoir, may also have the function of an "air lock" in that, after having been filled into reservoir 10, the precursor material is prevented to be exposed to ambient air.

The reservoir 10 has an output $10_o$ for liquid precursor material. After filling or refilling reservoir 10 the liquid precursor material is transferred via output $10_o$ to a distillation tank of a distillation unit 11. Thereby, in a good embodiment, a small amount of liquid precursor material is left in reservoir 10, above the level of output $10_o$, so as to prevent any gas or air leaving through output $10_o$.

Thereby, it is prevented that air or gas is introduced into the subsequent distillation unit 11 and that precursor material degradation is caused by undesired contact with ambient air or possibly another gas.

STEP2: Distillation of Liquid Precursor Material

As the precursor material is or at least predominantly comprises a compound or mixture of coating substance CS and of a solvent SO, the precursor material under this first aspect of the present invention is distilled before vaporizing the liquid coating substance CS which has been substantially separated from the solvent SO by distilling remote from and upstream the vaporizing STEP3.

The distilling unit 11 as of FIG. 2, remote from a vaporizing compartment 12, comprises an input $11_i$, named first input, operationally in flow connection with output $10_o$ of reservoir 10 and has an output $11_{o1}$, named first output, and an output $11_{o2}$, named second output. Through second output $11_{o2}$ vaporized solvent SO is removed, whereas through first output $11_{o1}$ at least predominantly liquid coating substance CS is output from distillation unit 11. Distillation in distillation unit 11 is performed by vacuumizing a distillation chamber or tank and/or by heating same. Thus, and according to FIG. 2 a distillation chamber or tank of distillation unit 11 is operationally connected to a pump arrangement and/or a heater arrangement as schematically shown in FIG. 2 at 11'.

Within distillation unit 11 the solvent SO is evaporated from the precursor material. For certain precursor materials it is important to evaporate in the distillation unit the solvent SO very slowly so as to avoid splashing of precursor material due to bubbles. If such splashing occurs it spreads coating substance CS onto the walls of a distillation tank or chamber within distillation unit 11, whereby an amount of coating substance CS is wasted. In such cases distillation in distillation unit 11 is performed slowly, generically speaking by slow heating up the precursor material and/or slow pumping down the pressure within the distillation tank or compartment in distillation unit 11. In the addressed case of splashing risk performing two pumping down modes are recommended to be applied:

Slow pumping mode through a pumping line with a restricted flow diameter of e.g. 0.2 mm, then Fast pumping mode e.g. through a larger pumping line, e.g. a DN 16 ISO KF pumping line.

The switching from slow pumping (a) to fast pumping (b) mode can thereby be controlled by a timer unit 13 as shown in dash line in FIG. 2, e.g. to apply three minutes, i.e. during a first time span, the slow pumping mode (a), followed, during a second time span, by operating the fast pumping mode (b) to achieve a low pressure, e.g. in the 0.1 mbar range. Other pumping schemes are of course possible and may be time-controlled by the timer unit 13. Further, the timer unit 13 may, more generically, be exploited to control a heating arrangement as of unit 11' of FIG. 2, possibly in combination with controlling the pumping arrangement. The pumping arrangement for evacuating the distillation tank or compartment in distillation unit 11 may be realized e.g. with a diaphragm pump qualified for pumping chemical vapour and with a condenser connected to the pump exhaust to collect the vapour of solvent SO. It has to be noted that if distillation in distillation unit 11 is performed under vacuum regime, then the second output $11_{o2}$ as of FIG. 2 is in fact realized by the suctioning port of distillation unit 11 to the respective pumping arrangement. This is addressed in FIG. 2 by the output $11_{o2}$ in brackets.

So as to monitor pressure and/or temperature within distillation unit 11 a respective sensor arrangement (not shown in FIG. 2) may be provided. Thereby, very often the solvent material SO is flammable. Therefore, providing such sensor arrangement in the distillation unit 11 as well as any other equipment exposed to liquid solvent and/or vapour thereof may be a safety concern. As an example a pressure monitoring sensing arrangement in distillation unit 11 may have a vacuum switch that interlocks the operation of a filament type pressure gauge. A distillation tank or compartment within distillation unit 11 may have e.g. the following vacuum measurement equipment installed:

a diaphragm relative pressure gauge to monitor distillation chamber pressure during distillation in the range from atmospheric pressure down to 5 mbar a vacuum switch of Baratron type with a set point of 5 mbar a TC gauge for measuring the pressure in the 5 mbar to 0.1 mbar range.

The vacuum switch interlocks the TC gauge which has a hot filament; the 5 mbar value has been calculated as a safety pressure at which an igniting mixture cannot build up in the distillation tank or compartment of distillation unit 11, especially at the pump exhaust as of ($11_{o2}$).

So as to accurately control distillation within distillation unit 11 it may be desirable to perform distillation by isothermal evaporation of solvent SO. This facilitates distillation process control in view of possibly high thermal inertia of the distillation unit. To perform the distillation process and thus solvent evaporation in an isothermal manner the temperature of a distillation tank or compartment within distillation unit may be negative feedback controlled or may be held constant in non-feedback controlled manner as e.g. by providing a cooling or heating medium circulation system at the addressed tank or compartment, e.g. a water circulation system. Equally to other equipments for monitoring and/or controlling the distillation process, a negative feedback temperature control loop or, as addressed, a circulating system is not shown in FIG. 2.

Termination of the distillation process within distillation unit 11 may be controlled by pressure monitoring in that the solvent SO is considered to be completely evaporated and removed when the pressure in the distillation tank or compartment within distilling unit 11 has dropped e.g. in the 0.1 mbar range. At this point liquid coating substance CS is transferred towards and into the vaporizer compartment 12 as will subsequently be addressed.

STEP3: Transfer of Coating Substance into Vaporizer Compartment and Vaporizing

In a vaporizer compartment 12 thermal evaporation of a predetermined portion of the result of the distillation in distilling unit 11 is performed. The vaporizer compartment 12 has an input $12_i$, named second input, for a portion of liquid coating substance $CS_p$ and has an output $12_o$, named third output, for vapour of the vaporized portion $CS_p$. A controllable valve arrangement 20, shown in FIG. 2 as an on/off flow switch, is equipped with a control input $20_c$, named first control input. A control output $14_{O1}$, named first control output, of a control unit 14 is operationally connected to the first control input $20_c$ of valve arrangement 20. As shown in FIG. 2 control unit 14 may incorporate timer unit 13 for controlling the distillation process at distillation unit 11.

The vaporizer compartment 12 is equipped with a controllable heater arrangement 16 for thermally vaporizing the coating substance portion $CS_p$.

STEP4, 5: Vapour Ejecting and Substrate Coating

The output $12_o$ of vaporizer compartment 12, the third output, is operationally connected to an input $18_i$, named third input, of a vapour distribution nozzle 18 equipped with a distribution opening arrangement 21. The distribution nozzle 18 is a part of a vapour distribution nozzle arrangement 22. The opening or the openings of distribution opening arrangement 21 open into a vacuum recipient 24, wherein a substrate arrangement with one or more than one substrates 28 is supported upon at least one substrate carrier 26 which is positionable by means of a controlled drive 30 into a coating position opposite opening arrangement 21. Substrates within vacuum recipient 24 are exposed to vapour of coating material CS ejected through opening arrangement 21 and are thereby coated. Thereafter they are removed from the vacuum recipient—STEP6—as by means of the controlled drive 30 acting upon substrate carrier 26. At this point it should be noted that the substrates 28 as brought into vacuum recipient 24 may have been pre-treated as by reactive ion etching and/or by depositing a layer thereon in the vacuum recipient 24 or in a separate pre-treatment chamber. In analogy once coated according to the present invention, substrates 28 may be further treated by any convenient surface treatment process, be it still in vacuum recipient 24 or in a downstream processing unit.

The vacuum recipient 24 is pumped by a controlled pump arrangement 32.

Vaporizer compartment 12 may be separately pumped by a controlled pump arrangement 34.

The apparatus as exemplified in FIG. 2, which performs manufacturing of coated substrates as of FIG. 1 may be operated in different modes.

Figure 3:
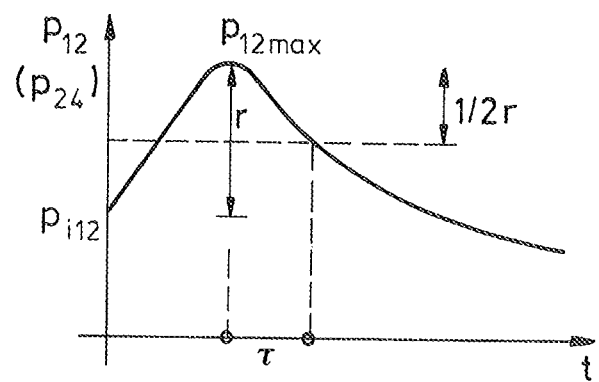

Single-shot Evaporation:

In this mode valve arrangement 20 is controlled to pass a predetermined portion of the liquid coating substance CS—just for a single vapour shot—into vaporizer compartment 12. The portion of coating substance passed from distilling unit 11 into vaporizer compartment 12 by respective control of valve arrangement 20 is significantly smaller than the content of liquid coating substance held in distilling unit 11. The small portion of liquid coating substance CS is evaporated in vaporizer compartment 12 by respectively setting the initial pressure therein as by pump arrangement 34 and heating the compartment 12 by controlled heater arrangement 16. Thermal evaporation of the liquid coating substance CS in vaporizer compartment 12 leads therein, as qualitatively shown in FIG. 3, to a rise of the pressure $p_{12}$ departing from working point initial pressure $p_{i12}$. Simultaneously occurring outflow of vapour of coating substance towards the distribution nozzle 18 and ejecting thereof through opening arrangement 20 leads to a subsequent drop of the pressure $p_{12}$, thereby establishing a maximum pressure $p_{12max}$. The vapour of coating substance CS is thus propelled from vaporizer compartment 12 downstream up to deposition upon substrate 28 at least enhanced by a pressure gradient from pressure $p_{12}$ in compartment 12 to pressure $p_{24}$ in the vacuum recipient 24. Parameters such as the volume of liquid coating substance CS fed to vaporizer compartment 12, the volume of compartment 12, heating by means of controlled heating arrangement 16, initial pressure $p_{i12}$ within vaporizer compartment 12, downstream vapour flow characteristics as of a flow resistance 36 between output $12_o$ and input $18_i$, of characteristics of the nozzle 18 and its opening arrangement 21 as well as pressure gradient between vaporizer compartment 12 and pumped vacuum recipient 24 are tailored and set to establish in the vaporizer compartment 12 a pressure characteristic which, as shown in FIG. 3, rises by an amount r to a maximum pressure $p_{12max}$ and drops by half of the pressure rise ½ r as shown in FIG. 3 within a time span τ from reaching maximum pressure $p_{12max}$ within at most 10 sec. As this time span is significant for the rate with which under the presently addressed operation mode shots of vapour are ejected towards substrate 28 and substrate 28 is coated, in today's embodiment such time span τ is tailored to be at most 5 sec. and even at most 1 sec.

The time span τ has a minimum value of at least 0.5 sec.

Thus, by the addressed operation mode the complete result of coating substance evaporation in vaporizer compartment 12 is ejected towards the substrates 28 to be coated in a single shot. This does not necessarily mean that coating as desired is performed by such single vapour shot as the substrates 28 may be coated by more than one such vapour shot.

In multiple-shot coating, ejection of vapour through the opening arrangement 21 is performed in time-discreet shots of the result of vaporizing one portion in vaporizer compartment 12. The volume of the vaporizer compartment 12 for one shot vaporizing mode may be very small, in the range of some few cm³ and dependent of the substrate surface extent and of coating thickness to be achieved by a single vaporized portion of coating substance CS. Therefore, monitoring the pressure course as of FIG. 3 in the small vaporizer compartment 12 itself may be difficult to practice.

Because one may assume that the pressure time course characteristic as occurring in vaporizer compartment 12 is pictured in vacuum recipient 24, especially with respect to time span τ, the parameters as addressed above which are decisive for the addressed pressure course are tailored so as to achieve such pressure course especially with respect to τ in the vacuum recipient 24, where it is no problem to monitor the pressure $p_{24}$.

As shown in FIG. 2 in dash line there may be provided in vacuum recipient 24 a pressure sensor arrangement 40. The pressure indicative output thereof is either exploited just to monitor the overall coating process and/or may be used as a measured pressure value X within a negative feedback control loop, where such sensing result X is compared with a desired signal W, and the comparing result Δ is exploited to adjust the coating process as by adjusting quantity of liquid coating substance CS portionized into vaporizer compartment 12 and/or the rate of such portionizing and/or pressure and/or heating in vaporizer 12, movement of substrate carrier 26 by means of controlled drive 30, etc. via controller unit 14.

As shown in FIG. 2 the rate at which—especially for one-shot vaporizing—small portions of coating substance CS are fed from the distillation unit 11 to vaporizer compartment 12 is controlled by operation of the valve arrangement 20, which is controlled by a controlled pulse generator 42 within control unit 14. The pulse repetition frequency $f_1$ controls the addressed rate, whereas pulse length controls the respective opening time spans of valve arrangement 20 establishing flow communication. For feeding small portions of liquid coating substance to the vaporizer compartment 12 the valve arrangement 20 may be tailored to accurately allow flow communication only during small time spans e.g. of at most 30 msec.

For ejecting more than one vapour shot from one portion vaporized, the compartment 12 is exploited as a reservoir for vapour. In this mode a further valve arrangement 44 is interconnected between output $12_o$, i.e. the output of vaporizer compartment 12, and input $18_i$, to the distribution nozzle 18. The valve arrangement 44, symbolized by a flow-switch, has a control input $44_c$, named a second control input, whereas control unit 14 has a control output $14_{o2}$, named second control output, operationally connected to control input $44_c$.

Within vaporizer compartment 12 a pressure course as described in context with FIG. 3 and for single-shot vaporizing does not occur, but only in vacuum recipient 24 in the rhythm of ejecting vapour shots from vaporizer compartment 12.

As shown in FIG. 2 control pulses to control input 44c of valve arrangement 44 are generated within control unit 14 by a pulse generator 46. As schematically shown in FIG. 2 the two pulse generators 42 and 46 are synchronized. The repetition frequency $f_2$ of valve controlling pulses to control input $44_c$ is at least equal to the pulse repetition frequency $f_1$. If the addressed pulse repetition frequency $f_2$ is equal to $f_1$, this means in fact single-shot vaporizing is operated by valve arrangement 44. If frequency $f_2$ is larger than $f_1$, then multiple-shot vaporizing is performed as was just addressed. The output $12_o$ is operationally connected to input $18_i$ of nozzle 18 with or without valve arrangement 44 via flow resistance element 36.

Such a flow resistance element 36 may be one or more than one flow channel of restricted diameter. As a good embodiment the flow-resistance element is realized by a flow diffuser element, thereby especially a porous ceramic or metal member, especially a metal foam member. This leads to a very compact combination of vaporizer compartment 12 and nozzle arrangement 22 as will be described in more details in context with the third aspect of the invention.

Still with an eye on the multiple-shot evaporation mode it must be emphasized that also in this mode coating of the substrate may be performed by a single vapour shot or by multiple vapour shots.

If, as a good embodiment, a flow resistance element 36 is provided, vapour flow along and through such element may be a laminar flow.

In a further highly advantageous embodiment there is superimposed to the vapour ejection at opening arrangement 21 a flow of a transport gas. In a good embodiment such transport gas is an inert gas as of argon and/or nitrogen. Such superimposed gas flow is thereby advantageously established continuously at least during coating of substrates, thus during single or multiple ejection of vapour shots. According to FIG. 2 this good option may be realized by providing a gas reservoir 48 for the addressed gas. The gas reservoir 48 is linked by one or more than one gas supply lines to

- line 17 upstream distillation unit 11 via a control valve $50a$ and/or into distillation unit 11 via a control valve $50b$ and/or
- between output $11_{o1}$ of the distillation unit 11 and input $12_i$ to vaporizer compartment 12 via a control valve $50_c$ and/or
- to the vaporizer compartment 12 via control valve $50_d$ and/or
- between output $12_o$ of vaporizer compartment 12 and input $18_i$, via control valve $50_f$.

In a good embodiment gas flow from gas tank 48 is established upstream vaporizer compartment 12 and an advantageously laminar gas flow is established through compartment 12, down to vacuum recipient 24. By this flow of transport gas vapour transport out of compartment 12 is substantially enhanced through the flow resistance element 36.

Vacuum recipient 24 is pumped by controlled pump 32, continuously at least during coating of the substrates 28 by one or multiple shots.

The ejection opening arrangement 21 provides for openings with opening axes parallel to an axis A as shown in FIG. 4a, thereby performing ejection substantially coaxially to the addressed axis A. In a second variant of the addressed opening arrangement 21 the openings have opening axes which are directed radially outwards from axis A. Thereby, ejecting is performed with a component of ejecting direction radially outwards from the axis A. The addressed radial component is the predominant component of direction. In a further variant of the addressed opening arrangement, which is today the preferred one, an opening is provided in a manner to generate a ring-shaped substantially continuous ejection pattern of vapour, coaxially to the axis A, as will specifically be discussed in context with the third aspect of the invention.

Figure 4:
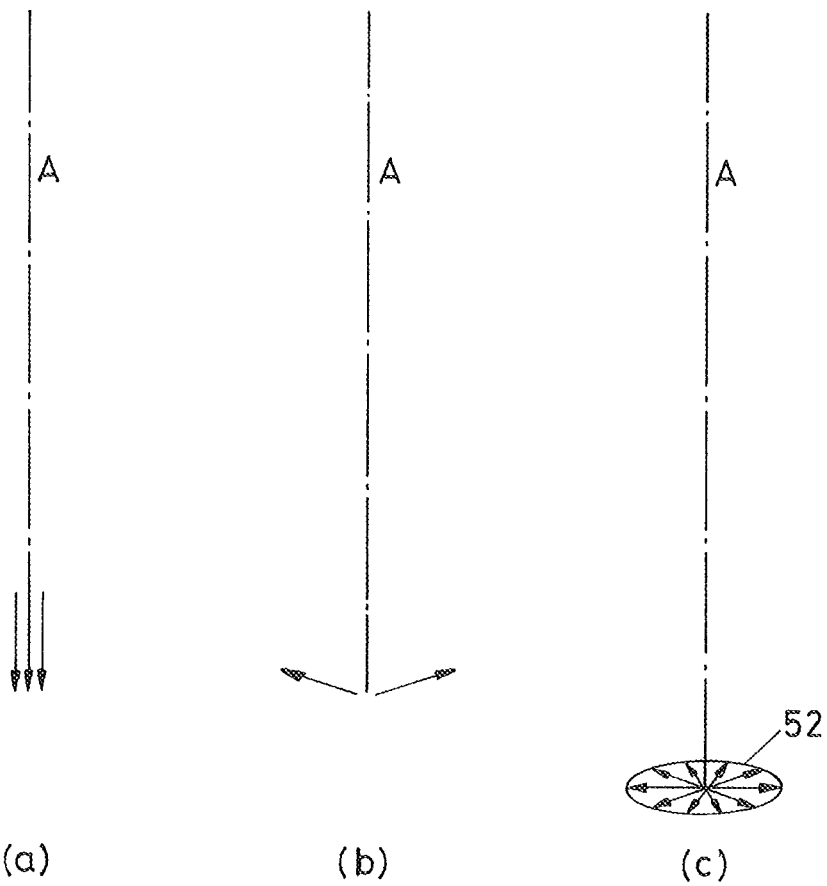

With an eye on FIG. 2, where axis A according to FIG. 4 is drawn in dash-dotted line, in a good variant substrate 28 or a multiple-substrate substrate arrangement is located for and during coating centralized about axis A, distant from and opposite the opening arrangement 21.

Further, it may be advantageous to additionally heat the vapour shots downstream the output $12_o$, i.e. along at least a part of flow resistance element 36 and/or along at least a part of nozzle 18 and even within vacuum recipient 24 by respective heating elements not shown in FIG. 2.

In an embodiment of the apparatus and method according to the first aspect of the invention multiple-substrate carriers 26 and thus arrangements of substrates 28 are sequentially positioned within vacuum recipient 24 in coating position. One set of substrates is coated, removed from coating position and the next set of substrates is brought into the coating position. According to FIG. 2 this is controlled by pulsed controlling the controllable drive 30 as by a pulse generator 56. Thereby, and in a good embodiment, the substrate carriers 26 are brought into and removed from the coating position at a rate of at least one per 20 sec. or even at a rate of at least one substrate carrier per 10 or even per 5 sec. Thereby, a high throughput of substrates is achieved.

Figure 5:
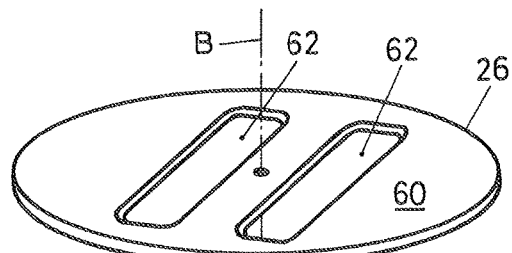

FIG. 5 shows in a simplified perspective view a substrate carrier 26. It comprises a plate-like member 60 with one or more than one, as shown e.g. with two, 4-angular intrusions 62, wherein accordingly shaped substrates are supported.

The central axis B of substrate carrier 26 is advantageously brought into alignment with axis A of the opening arrangement for substrate coating.

The substrates to be coated and thereby especially screen substrates, thereby especially touch-screen substrates, are advantageously and as was generically addressed above pre-treated by e.g. reactive ion etching and/or by depositing, before the coating according to the invention, a transparent layer as of at least one of $SiO_2$, SiN, $Al_2O_3$, AlN.

By preventing air to be present in distillation unit 11, which latter is advantageously kept under vacuum, there is prevented degradation of the precursor material. This is also achieved by gas e.g. from gas tank 48 fed into distillation unit 11.

Monitoring the vapour content in vaporizer compartment 12 may be performed by a vacuum gauge (not shown in FIG. 2) and/or by measurement of the level of remaining liquid coating substance CS in vaporizer compartment 12. As was addressed the vaporizer compartment 12 is advantageously kept at an elevated temperature, e.g. of 200° C. also to prevent vapour from re-condensing along the compartment wall.

The flow connection downstream vaporizer compartment 12 is as well advantageously heated e.g. to 200° C.

Figure 6:
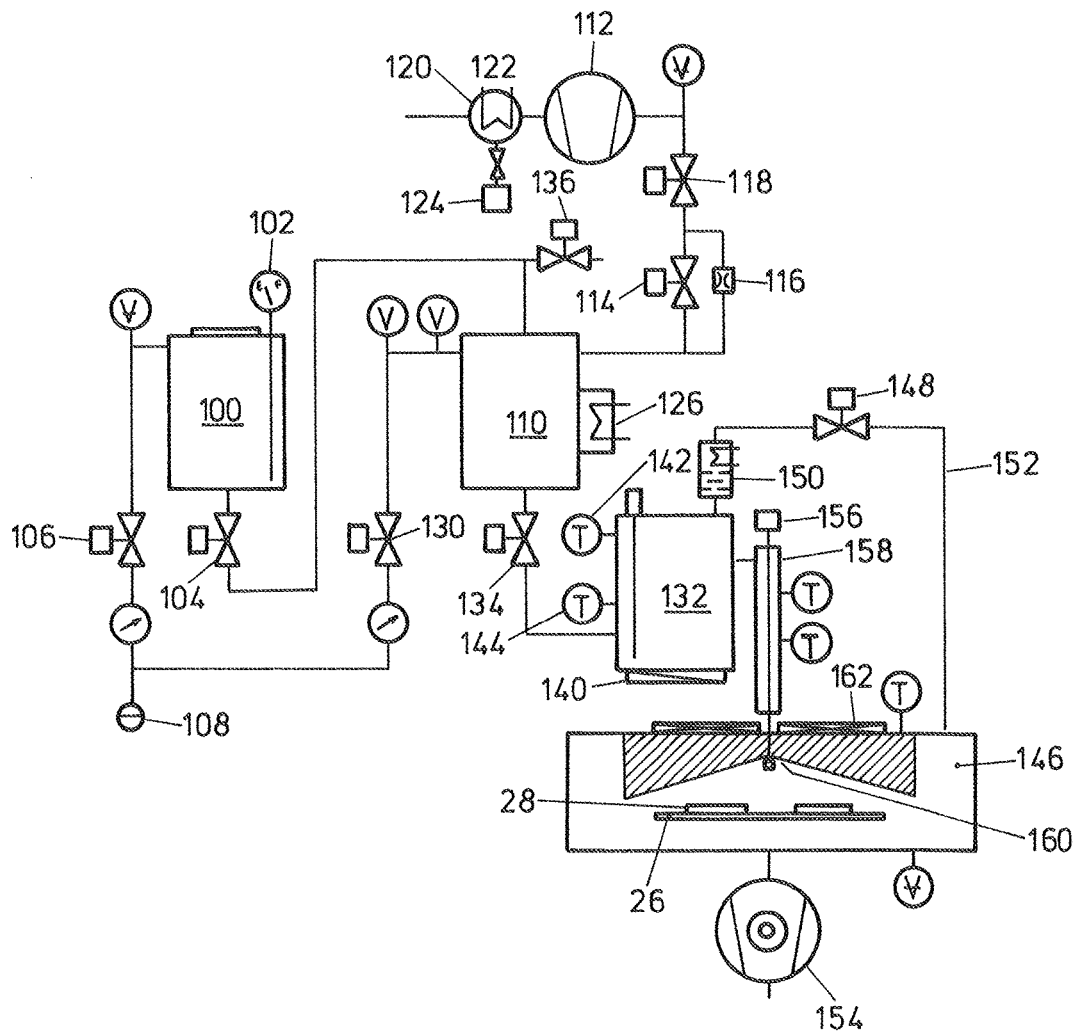

FIG. 6 shows, still simplified and schematically, but in more detail, one embodiment of an apparatus according to the present invention under the first aspect, performing under that aspect the method of manufacturing according to the invention.

A reservoir tank 100 holds the liquid precursor material, which comprises the coating substance CS and the solvent SO. The level of precursor material in tank 100 is monitored by a level sensor 102. By opening a valve 104 precursor material can be made to flow into tank 100, by also opening a valve 106 and applying a positive gas pressure to the top of tank 100 from a gas supply 108. The precursor material is distilled in tank 110 of the distilling unit by applying vacuum thereto by means of a vacuum pump 112. During a first phase of distillation, fast pumping valve 114 is closed and pumping is applied to tank 110 via slow pumping restriction 116. By pumping through the slow pumping restriction 116 and as was addressed above in context with FIG. 2, the distillation initially proceeds slowly preventing splashing of precursor material and reducing loss of coating substance. At the end of the slow pumping mode, fast pumping valve 114 is opened, bypassing restriction 116, and vacuum distillation can proceed rapidly. Valve 118 is a pump 112 cut-off valve for isolating the tank 110 from pump 112. Downstream of the pump 112 there is provided a solvent condenser 120 which is cooled by cooling water in water circuit 122 and by thus recovering the solvent which is subsequently collected in a solvent cup 124. Tank 110 is provided with a thermostat 126 which controls a water-based temperature regulation system such as a water jacket or similar heat exchanger arranged to maintain the temperature of tank 110 constant as the solvent evaporates off.

Once substantially all of the solvent has evaporated from the precursor material leaving substantially solvent-free coating substance in the bottom of tank 110, vacuum distillation pump 112 is switched off, valve 118 is closed, thereby isolating the pump 112 from the tank 110. Subsequently a valve 130 is opened and gas supply 108 applies positive pressure to distillation tank 110 so as to drive the liquid coating substance into evaporation compartment 132 upon opening of valve 134. The tank 110 is provided with a pressure-relieving valve 136 to relieve the pressure therein after termination of coating substance transfer to vaporizer compartment 132.

Vaporizer compartment 132 is provided with a heating element 140 for heating tank 132 to the evaporation temperature of the coating substance. This temperature is monitored by thermocouple 142. The vaporizer compartment 132 is further provided with an over-temperature switch 144 for detecting when compartment 132 has overheated. The compartment 132 acting as a part of a vapour source, is placed under vacuum by being in flow communication with a vacuum recipient 146 via a high vacuum bypass valve 148 and a Messner trap 150 protecting the high vacuum pump line 152 from material condensation. The Messner trap 150 is cooled by cooling water.

From vaporizer compartment 132 the evaporated coating substance is fed to the interior of vacuum recipient 146 which is pumped to a high vacuum by high vacuum pump 154. Thereby, a valve 156 is operated which releases shots of vapour through flow channel conduit 158 into the vacuum recipient 146 via the vapour distribution nozzle arrangement 160, which is heated by heater element 162.

Advantageous forms of realizing the vapour distribution nozzle arrangement 160 will be described in greater details in context with the third aspect of the invention. It should be noted that compartment or tank 132 and vapour distribution nozzle arrangement 160 together form part of a vapour source which as well may advantageously be realized in one of the variants discussed below. It has further to be noted that in the embodiment of FIG. 6 the nozzle arrangement 160 is heated by heater element 162.

Second Aspect of the Invention: No Distinct Distillation

The second aspect of the invention provides for an improvement over the invention under its first aspect and is especially suited for some types of precursor material. Coating substrates with specific types of coating, thereby especially with oleophobic coatings, poses some problems in that once the solvent has been removed from the precursor material, the coating substance has a consistency like honey and is thus difficult to handle for accurate dosing, especially in small doses. As an example in such a case and with an eye on FIG. 2 which was discussed in context with the first aspect of the invention, it is difficult to make sure that coating substance CS is transferred to the evaporation compartment 12 in accurate portions and thus the coating resulting on the substrates 28 may vary from substrate arrangement to substrate arrangement. Furthermore, in spite of the fact that the liquid coating substance downstream the distillation unit is held under vacuum, it does stabilize to a certain degree and an autopolymerization may occur, requiring more and more energy and thereby especially heat to evaporate the coating substance the longer the liquid coating substance remains in the distillation unit 11. The quality of the resulting coating can thus vary. In spite of the fact that also the embodiment under the first aspect of the present invention may be realized to vaporize single shots of coating substance, one of the reasons for the above mentioned problems is distillation of rather large amounts of precursor material, another reason is necessity to handle coating substance of possibly high viscosity from distillation to vaporization.

The invention under its second aspect resolves these problems in that it is undistilled precursor material which is handled up to evaporation and even downstream of such evaporation. Due to the presence of the solvent within the handled liquid its viscosity is low compared with the viscosity of just the coating substance as handled downstream distillation unit 11 according to FIG. 2. Additionally the volume of precursor material necessitated for a coating, i.e. for a given amount of coating substance, is larger than the volume just of the coating substance as handled according to the first aspect of the present invention. Both aspects allow more accurate dosing of portions to a vaporizer compartment. Furthermore, since the solvent remains in the precursor material, e.g. in the case of precursor material for depositing oleophobic coatings on substrates, autopolymerization of coating substance is largely prevented. This further improves the quality and reproducibility of the deposited coatings. Thus, and with an eye on first aspect's FIG. 1 the generic difference of the present invention under its second aspect is that a specific distillation step as of step 2 in FIG. 1, upstream the and remote from the vaporizing step 3, is omitted and in fact distilling is performed upon precursor material in vapour phase at and downstream vaporizing, up to the vapour having been ejected from an opening arrangement.

FIG. 7 depicts in a representation in analogy to that of FIG. 1 the processing steps of the method according to the present invention under the second aspect and as performed by an apparatus according to that second aspect of the present invention and as will be exemplified in FIG. 8, in analogy to the representation of invention's first aspect apparatus in FIG. 2.

From a reservoir for liquid precursor material $(CS+SO)_1$ as of STEP1' of FIG. 7 liquid precursor material is directly fed to vaporization. For better comparison with the invention under its first aspect, the vaporizing step in FIG. 7 is addressed as STEP3' in analogy to STEP3 in first aspect's FIG. 1. In opposition to evaporation according to STEP3 of FIG. 1, evaporation under STEP3' of FIG. 7 is performed upon liquid precursor material, thus the solvent SO still present. Thus, generically there is provided a vaporizing compartment to perform vaporizing STEP3' and there is injected a predetermined portion of liquid precursor material $(CS+SO)_1$ in the vaporizing compartment. Vaporizing this material is at least enhanced by heating as shown in FIG. 7 at Θ.

The second aspect of the invention is especially tailored for vaporizing just that amount of precursor material which is one-shot ejected, although it may not be excluded that the invention also according to the second aspect may be exploited for vaporizing a larger portion of precursor material and ejecting more than one shot out of that portion of precursor material vaporized.

Therefore, at first we focus on single-shot evaporation.

Due to the fact that the portion of liquid precursor material to be vaporized is substantially larger than the portion just of liquid coating substance as evaporated in step 3 of first aspect's FIG. 1, the pressure in the vaporizing compartment does most significantly rise. After or simultaneously with vaporizing, a result of the addressed vaporizing is ejected—STEP4'—through an opening arrangement 1' of a distribution nozzle arrangement 7' into a vacuum recipient 3' towards and upon an arrangement of at least one substrate 5' in the vacuum recipient 3'. Thereby, there is established—STEP5'—a coating of coating material on the arrangement of at least one substrate 5'. Then the arrangement of the at least one coated substrate 5' is removed from the vacuum recipient 3' —STEP6'. Pre-treatment and post-treatment of the substrates coated under the second aspect of the invention may be performed as was addressed under the first aspect of the invention.

With an eye on FIG. 7 STEP2' in fact addresses the distilling step in analogy to STEP2 of FIG. 1, but occurs as represented graphically in FIG. 7, during vaporization and/or vapour transfer to the nozzle arrangement 7' and/or even during coating in vacuum recipient 3'. Symbolized in FIG. 7 by the downwards pointing arrow at the solvent content SO is the decrease of solvent vapour content in the precursor material vapour, downstream vaporization.

FIG. 8 shows in an analogous representation to that of FIG. 2 a simplified signal flow/functional block diagram of an apparatus according to the second aspect of the invention and operating the method as was exemplified with the help of FIG. 7.

FIG. 8 is discussed in analogy to FIG. 2.

STEP1': Liquid Precursor Material in Reservoir

The apparatus as of FIG. 8 is equipped with a reservoir tank 200 for liquid precursor material $(SO+CS)_1$ as of STEP1 of FIG. 7. The capacity of reservoir tank 200 is ideally sufficient to provide coating substance for one to two weeks of continuous substrate manufacturing. Thus, e.g. simultaneously with a preventive maintenance of an apparatus or of equipment possibly provided to pre-treat a substrate to be fed into a vacuum recipient 224, of the equipment for coating according to the invention under the here addressed second aspect, of possibly provided equipment for post-treatment of coated substrates, reservoir tank 200 is filled or re-filled with a full charge of precursor material. Reservoir tank 200, also addressed throughout the present description and claims as reservoir, may also have the function of an "air lock" in that, after having been filled into reservoir 200, the precursor material is prevented to be exposed to ambient air.

The reservoir 200 has an output $\mathbf{200}_o$ for liquid precursor material. After filling or re-filling reservoir 200 the liquid precursor material is transferred through output $\mathbf{200}_o$ to a vaporizer compartment 212. Thereby, in a good embodiment, a small amount of liquid precursor material is left in reservoir 200, above the level of output $\mathbf{200}_o$, so as to prevent any gas or air leaving through output $\mathbf{200}_o$.

Thereby, it is prevented that air or gas is introduced into the subsequent vaporizer compartment 212 and that precursor material degradation is caused by undesired contact with ambient air or possibly another gas.

STEP3': Transfer of Liquid Precursor Material into Vaporizer Compartment and Vaporizing In a vaporizer compartment 212 thermal evaporation of a predetermined portion of precursor material is performed. The vaporizer compartment 212 has an input $\mathbf{212}_i$, named first input, for a portion of liquid precursor material $(SO+CS)_1$ and has an output $\mathbf{212}_o$, named first output, for vapour of precursor material $(CS+SO)_V$. A controllable valve arrangement 220 shown in FIG. 8 as a flow on/off switch is equipped with a control input $\mathbf{220}_c$, named first control input. A control output $\mathbf{214}_{01}$, named first control output, of a control unit 214 is operationally connected to the first control input $\mathbf{220}_c$ of valve arrangement 220. The vaporizer compartment 212 is equipped with a controllable heater arrangement 216 for thermally vaporizing the precursor material in vaporizer compartment 212.

For primarily addressed single-shot evaporation, only a small portion of precursor material is vaporized in vaporizer compartment 212 at a time. Precursor material for each ejected vapour shot is separately vaporized in vaporizer compartment 112 as a distinct portion. Put the other way round, the result of vaporizing is ejected in a single shot. The predetermined portion of liquid precursor material fed from reservoir 200 into vaporizer compartment 212 is, in a good embodiment, between $5 \times 10^{-5}$ µl and $5 \times 10^{-2}$ µl per cm$^2$ of surface to be simultaneously coated. In a further improved embodiment the portion is between $15 \times 10^{-3}$ µl and $25 \times 10^{-3}$ µl per cm$^2$ of the addressed surface to be coated. The vaporizer compartment has thereby a very small volume of between 0.005 cm$^3$ and 0.035 cm$^3$ per cm$^2$ of surface of a substrate carrier to be coated and has, in a good embodiment, a volume of between 0.015 cm$^3$ and 0.025 cm$^3$ per cm$^2$ of the addressed substrate carrier surface.

Figure 9:
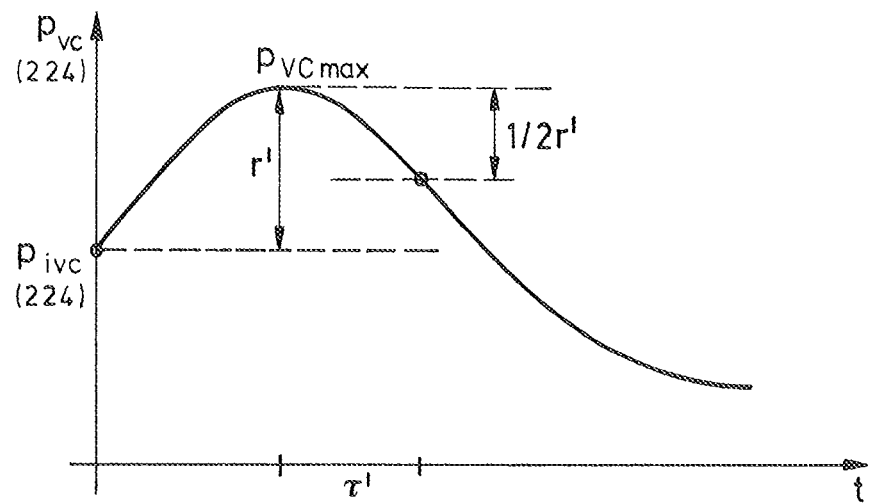

As shown in FIG. 9, due to evaporation of the precursor material portion in the vaporizer compartment 212 the pressure $p_{VC}$ in this compartment significantly rises by an amount of r', departing from the initial pressure $p_{iVC}$. Due to outflow of vapour through output 212$_o$ towards the vacuum recipient 224, the pressure $p_{VC}$ drops then from a maximum pressure $p_{VCmax}$ by half the amount of rise ½ r' within a time span τ' from reaching the addressed pressure maximum, which is at most 10 sec., in an improved embodiment even at most 5 sec., and, even better, of at most 1 sec. The addressed time span τ' is at least 0.5 sec. from reaching the addressed maximum $p_{VCmax}$.

The addressed time span τ' is one decisive parameter for the duration of ejecting a vapour shot and thus for coating a substrate by the coating substance of one vapour shot. It is thus a decisive parameter for throughput of substrates to be coated in the vacuum recipient 224.

The output 212$_o$ of vaporizer compartment 212 is in flow-operational connection with an input 218$_i$, named second input, of a nozzle 218 of a nozzle arrangement 222. The vapour distribution nozzle 218 is equipped with a distribution opening arrangement 221. The opening or the openings of the distribution opening arrangement 221 open into the vacuum recipient 224, wherein the substrate arrangement with one or more than one substrates 228 is supported upon a substrate carrier 226, which is positionable by means of a control drive 230 into a coating position opposite opening arrangement 221. Substrates 228 within vacuum recipient 224 are exposed to the vapour of coating substance CS co-ejected—STEP4'—through opening arrangement 221 and are thereby coated—STEP5'. Together with ejecting coating substance through opening arrangement 221 at least a remaining part of vaporized solvent SO$_v$ is ejected and removed by the pumping action of a controlled pumping arrangement 232.

After having been coated, the substrates 228 are removed—STEP6'—from the vacuum recipient as by means of the controlled drive 230 acting upon substrate carrier 226. At this point it should be noted that the substrate 228 as brought into vacuum recipient 224 may have been pre-treated as by reactive ion etching and/or by depositing a layer thereon in the vacuum recipient 224 or in a separate pre-treatment chamber. The vaporizer compartment 212 may be separately pumped by a controlled pump arrangement 234.

Figure 10:
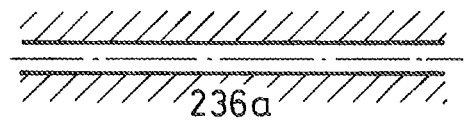
Figure 10:
Figure 10:
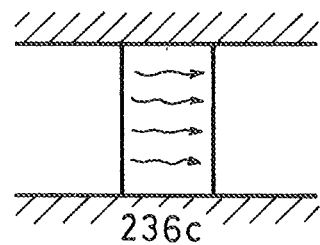

Between the output 212$_o$ and input 218$_i$ there is provided at least one flow-resistance element 236. Such flow-resistance element may be formed by one relatively long flow channel as shown at 236a in FIG. 10 and/or by a diffuser element realized by multiple parallel flow channels as shown in FIG. 10 by 236b and/or by a diffuser element made of a porous material as of ceramic or metal material, as schematically shown in FIG. 10 by reference number 236c and is, in a good embodiment, realized by a metal foam element. Please note that the flow-resistance elements as of FIG. 10 may also apply advantageously to the apparatus of FIG. 2 as the flow-resistance element 36.

As was already addressed above the invention under its second aspect is especially tailored for emptying vapour in vapour compartment 212 by a single ejecting shot.

Thereby, valve arrangement 220 is controlled to pass most accurately a very small predetermined portion of liquid precursor material into vaporizer compartment 212. The small portion of liquid precursor material is evaporated in the small vaporizer compartment 212. This leads to the pressure course as was discussed in context with FIG. 9. Thereby a pressure gradient from vaporizer compartment 212 down to vacuum recipient 224, which is pumped by pump arrangement 232, is established. Such pressure gradient propels the vapour of precursor material out of the vaporizer compartment 212. Parameters as the addressed volume of liquid precursor material fed to vaporizer compartment 212, the volume of that compartment 212, the heating of the compartment 212 by means of controlled heating arrangement 216, initial pressure $p_{iVC}$ in compartment 212, downstream vapour flow characteristics especially through flow-resistance element 236 and opening arrangement 221 as well as pressure gradient between vaporizer compartment 212 and pumped vacuum recipient 224 are tailored to establish the pressure characteristics in vaporizer compartment 112 as was discussed also in context with FIG. 9.

It should be pointed out that ejecting the complete amount of vapour of precursor material from vaporizing compartment 212 in one shot does not necessarily mean that coating as desired is performed by such single vapour shot, as a substrate 228 may be coated by more than one such vapour shots.

Figure 8:
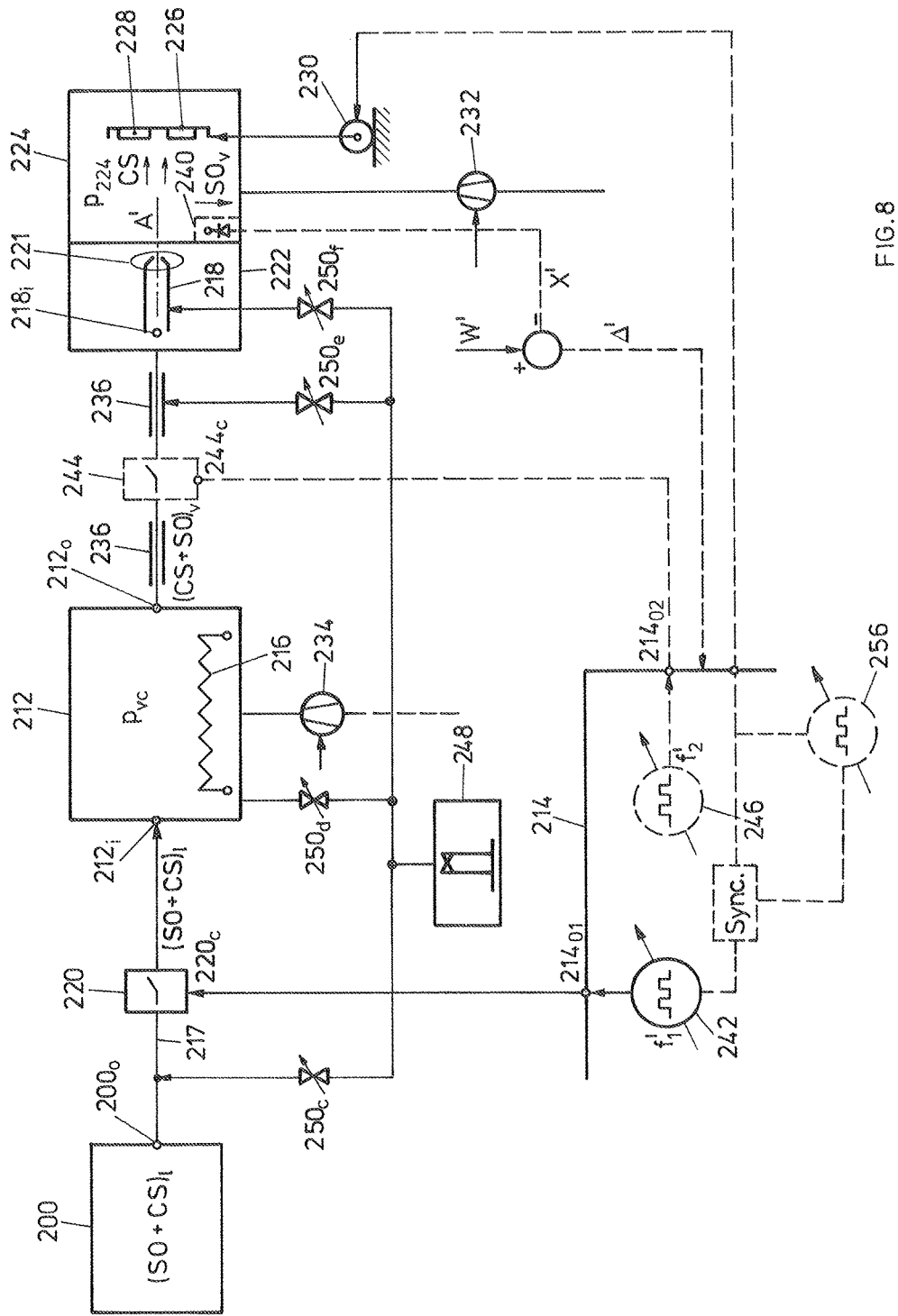

As was addressed above, the volume of the vaporizer compartment 212 for one-shot ejecting the vapour from compartment 212 is very small. Therefore, monitoring the pressure course as of FIG. 9 in the vaporizer compartment 212 itself may be difficult to practice. Because one may assume that the pressure vs. time course characteristics as occurring according to the invention in vaporizer compartment 212 is pictured in vacuum recipient 224, especially with respect to the time span τ', the parameters as addressed above, which are decisive for the pressure course according to the invention are tailored so as to achieve such pressure course especially with respect to τ' in the vacuum recipient 224, where it is of no problem to monitor the pressure $P_{224}$. Thus and as shown in FIG. 8 in dash line, there is provided in the vacuum recipient 224 a pressure sensor arrangement 240. The output signal thereof is either exploited just to monitor the overall coating process and/or may be used as a measured pressure value X' within a negative feedback control loop, where such sensing result X' is compared with a desired signal W' and the comparing result Δ' is exploited to adjust the coating process as by adjusting quantity of liquid precursor material portionized into vaporizer compartment 212 and/or the rate of such portionizing and/or pressure in and/or heating of vaporizer compartment 212, movement of substrate carrier 226 by means of controlled drive 213 etc., via controller unit 214.

As was addressed, the second aspect of the present invention provides no separate distillation step ahead or upstream the vaporizing step. Therefore, the question of how the solvent is separated from the coating substance should be addressed nevertheless in a more heuristical sense than in an exact scientific sense.

In vaporizer compartment 212 or, in method terms, during thermal vaporization, vapour of solvent and vapour of coating substance are co-produced. Both vapour components are fed via flow resistance element 236 to opening arrangement 221 and are ejected into vacuum recipient 224. Due to the much higher volatility of the solvent vapour component with respect to the coating substance vapour component the pump arrangement 232 removes a significantly larger amount of solvent vapour component from vacuum recipient 224 than of coating substance vapour component. Thus, the coating substance vapour component remains for a substantially longer time in vacuum recipient 224 which suffices to have that component deposited on substrates 228, whereas and as addressed by the arrow $SO_V$ in FIG. 8 practically all the solvent vapour component is rapidly removed from vacuum recipient 224 by the pumping action of pumping arrangement 232.

Heating of the flow line downstream the vaporizer compartment 212, thereby especially of the flow-resistance element 236 and of at least of a part of nozzle arrangement 222 and at least of that area within vacuum recipient 224 where ejecting is performed avoids re-condensation of the vapour components along rigid walls.

As shown in FIG. 8 the rate at which small portions of precursor material are fed from reservoir 200 to vaporizer compartment 212 is controlled by operation of the valve arrangement 220, which is thus in fact controlled by a controlled pulse generator 242 within controller unit 214. The pulse repetition frequency $f_1'$ controls the addressed rate, whereas pulse length controls the respective opening time spans of valve arrangement 220 establishing flow communication. For feeding the small portions of liquid precursor material to the vaporizer compartment 212 the valve arrangement 220 is tailored to accurately establish flow communication only during small time spans, e.g. of at most 30 msec.

Figure 7:
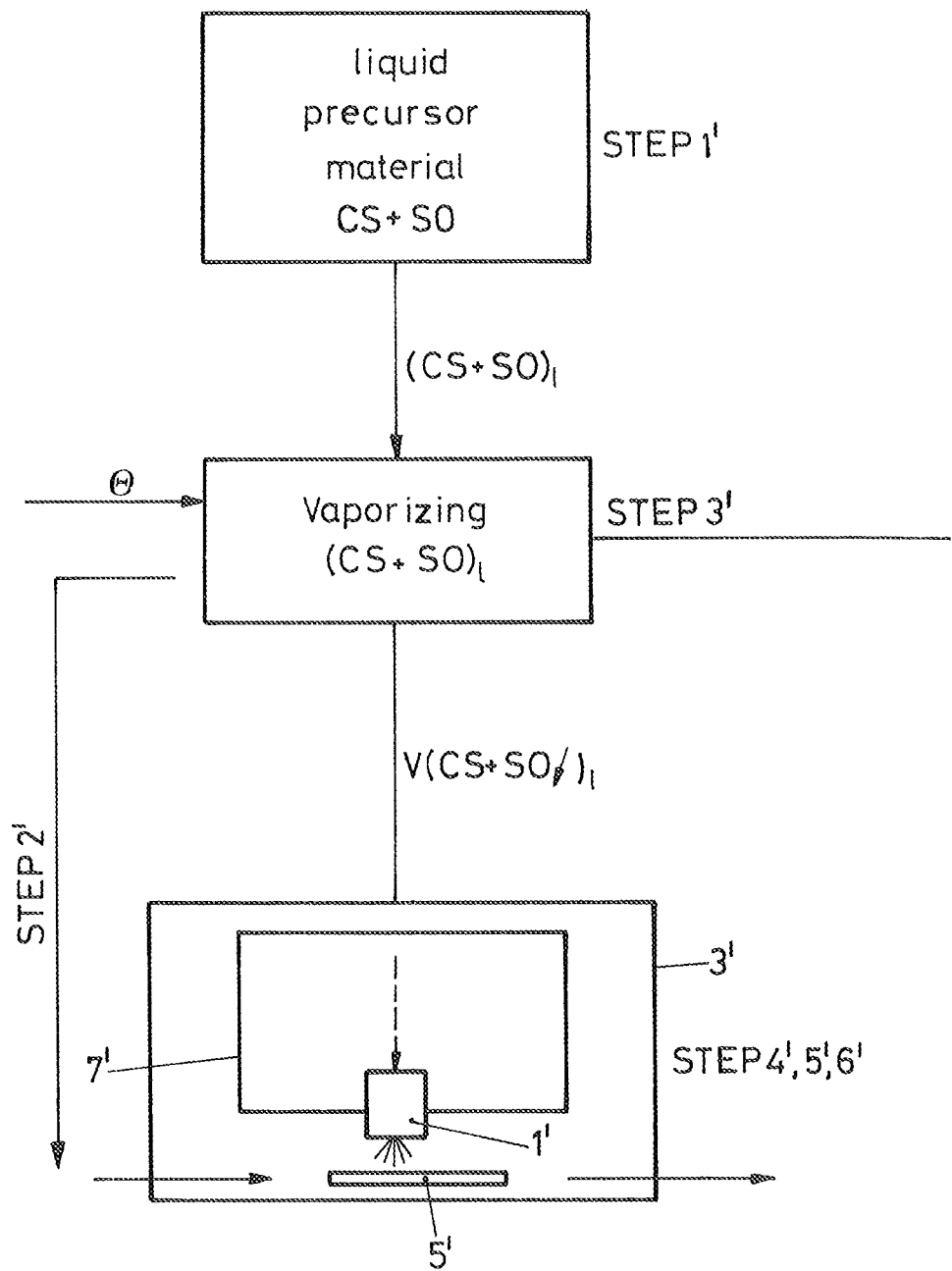

Up to now we have focussed discussion of the embodiment according to FIGS. 7 and 8 upon single-shot vaporizing. As was addressed above, also the present invention under its second aspect may be operated in multiple-shot vaporizing technique, i.e. vaporizing liquid precursor material in vaporizing compartment 212 for more than one single vapour shot.

For ejecting more than one vapour shot from one portion vaporized, the vaporizer compartment 212 is exploited as a reservoir for vapour. In this technique a further valve arrangement 244 is interconnected between output $212_o$, i.e. the output of vaporizer compartment 212 and input $218_i$, to the distribution nozzle 218. The valve arrangement 244, symbolized in FIG. 8 by a flow switch, has a controlled input 244c, named second control input, whereas control unit 214 has a control output $214_{O2}$, named second control output, which is operationally connected to control input $244_c$.

The rate and duration of the addressed shots out of one vaporized precursor material portion is controlled by appropriate control of valve arrangement 244. Realizing the present invention under its second aspect in this technique will lead to the fact that within vaporizer compartment 212, a pressure course as described in context with FIG. 9 will not occur, but rather a somehow "staircase" pressure versus time characteristic. A pressure course according to FIG. 9 will only occur in vacuum recipient 224 in the rhythm of ejecting vapour shots from vaporizer compartment 212.

As shown in FIG. 8 controlled pulses to control input $244_c$ of valve arrangement 244 are generated within control unit 214 by a respective pulse generator 246. The two pulsed generators 242 and 246 are synchronized. The repetition frequency $f_2'$ of valve controlling pulses to control input $244_c$ is at least equal to the pulse repetition frequency $f_1'$. If the addressed pulse repetition frequency $f_2'$ is equal to $f_1'$, this means in fact single-shot vaporizing is operated with valve arrangement 244. If the frequency $f_2'$ is larger than $f_1'$, then multiple-shot vaporizing is performed as just addressed. Also in the here addressed multiple-shot evaporation technique it must be emphasized that coating of the substrate 228 may be performed by a single vapour shot or by multiple vapour shots. Vapour flow along and through flow resistance element 236 may be advantageously a laminar flow.

Completely independent from the fact whether the invention according to its second aspect is operated in today preferred single-shot vaporizing or today less preferred multiple-shot vaporizing technique, it is highly advantageous to superimpose to the vapour ejection at opening arrangement 221 a flow of a transport gas. Thereby, in a good embodiment such transport gas is an inert gas such as argon and/or nitrogen. Such superimposed gas flow is thereby advantageously established continuously at least during coating of substrates 228, thus during single- or multiple-ejection of vapour shots. According to FIG. 8 this may be realized by providing a gas reservoir 248 for the addressed gas. The gas reservoir 248 is linked by one or more than one gas supply lines to a liquid supply line 217 between output $200_o$ and input $212_i$, via a control valve $250_c$ and/or to the vaporizer compartment 212 via control valve $250_d$ and/or to the vapour flow connection between output $212_o$ and input $218_i$, as via a control valve $250_e$ and/or to nozzle 218 via control valve $250_f$.

The vacuum recipient 224 is pumped by the controlled pump arrangement 232, continuously at least during coating of the substrates 228 by one or multiple vapour shots.

The ejection opening arrangement 221 provides for one or more than one openings with opening axes parallel to an axis A as shown in FIG. 4a, thereby performing ejection substantially coaxially to the addressed axis A. In a second variant of the addressed opening arrangement 221, the openings have opening axes which are directed radially outwards from an axis A. Thereby, ejecting is performed with a component of ejecting direction radially outwards from the axis A. The addressed radial component is the predominant component of ejecting direction. In a further variant of the opening arrangement 221, which is today realized, openings are provided in a manner to generate a ring-shaped, substantially continuous ejection pattern of vapour coaxially to axis A as will specifically be discussed in context with the third aspect of the present invention, which may be combined with the first aspect of the invention as well as especially with its second aspect as described to now.

With respect to the gas flow out of gas reservoir 248 in a today practiced embodiment such gas flow is established from gas tank 248 to a locus upstream vaporizer compartment 212 or into compartment 212 in a laminar gas flow down to the vacuum recipient 224. By this flow of this transport gas vapour transport out of the vaporizer compartment 212 is substantially enhanced through flow resistance element 236.

Again with an eye on FIG. 8, where the axis A according to FIG. 4 is drawn and addressed by A' in dash-dotted line, in a good variant the substrate arrangement, be it of single or multiple substrates 228, is located for and during coating centralized about axis A, distant from and opposite the opening arrangement 221. As was already addressed, the vapour shot downstream output $212_o$, i.e. along flow resistance element 236 and/or along at least a part of nozzle 218 and even within vacuum recipient 224 are heated by a respective heating element not shown in FIG. 8.

In an embodiment of the apparatus and method according to the second aspect of the invention multiple-substrate carriers 226 and thus arrangements of substrates 228 are sequentially positioned within vacuum recipient 224 in coating position. One set of substrates 228 is coated, then removed from coating position and the next set of substrates 228 is brought in coating position. According to FIG. 8 this is controlled by pulsed controlling of the controllable drive 230 as by a pulse generator 256. Thereby and in a good embodiment the substrate carriers 226 are brought and removed into and from coating position at a rate of at least one per 20 sec. or even at a rate of at least one substrate carrier per 10 sec. or even per 5 sec. Thereby, a high throughput of substrates is achieved. The substrate carrier 226 may be conceived equally to the substrate carrier 26 shown in FIG. 5. We refer to the description of that substrate carrier in context with FIG. 5.

The substrates to be coated and thereby especially screen substrates, thereby especially touch screen substrates, are advantageously and as was generically addressed above, pre-treated by e.g. reactive ion etching and/or by depositing, before coating according to the invention, a transparent layer as of at least one of $SiO_2$, $SiN$, $Al_2O_3$, $AlN$.

Monitoring the vapour content in vaporizer compartment 212 may be performed by a vacuum gauge (not shown in FIG. 8) and/or by measurement of the level of remaining liquid precursor material therein. The vaporizer compartment 212 is advantageously kept at an elevated temperature, e.g. of 200° C. also to prevent vapour from re-condensing along the compartment wall.

Figure 11:
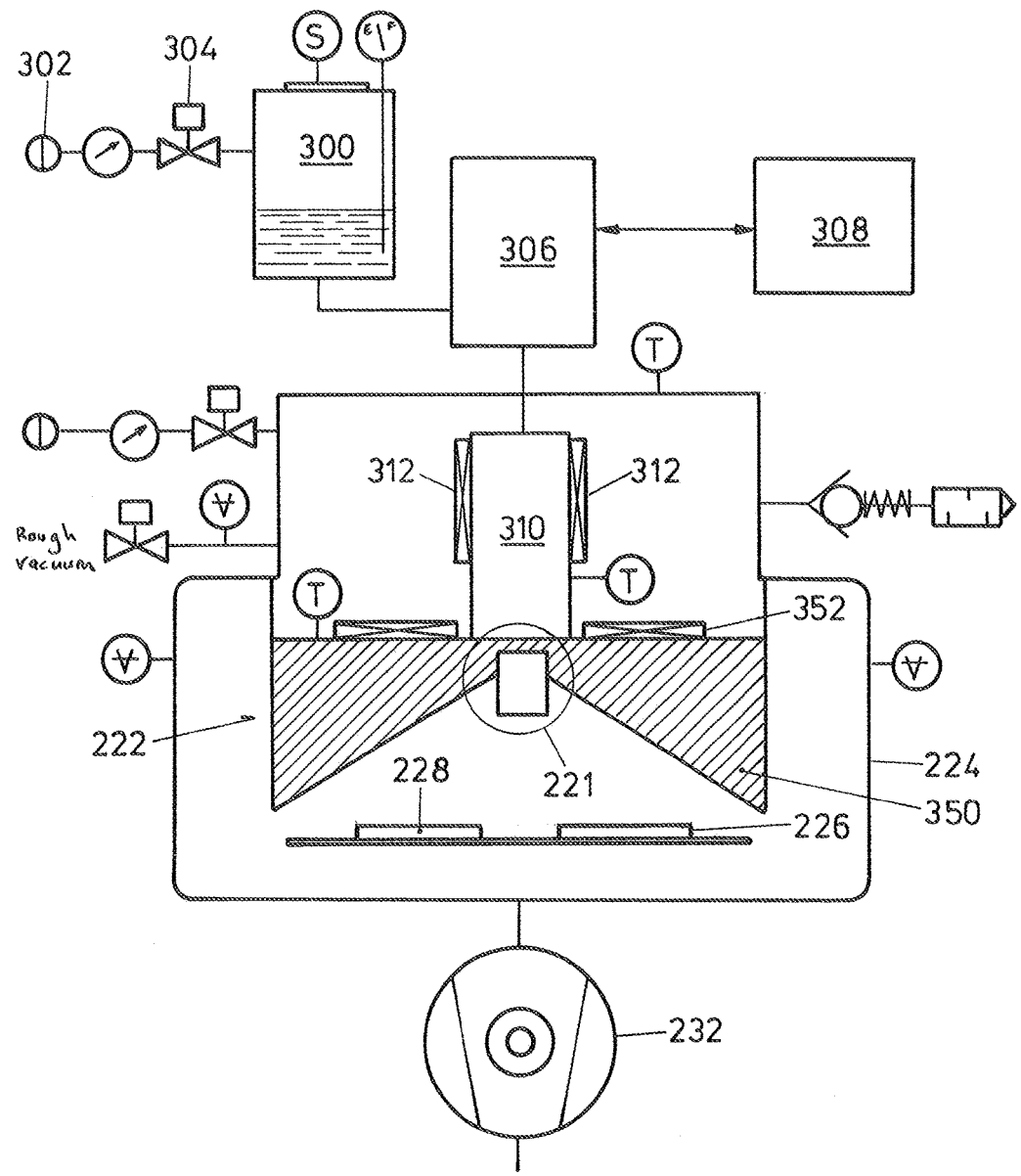

FIG. 11 shows in more details an embodiment of the apparatus according to the second aspect of the present invention performing the manufacturing method according to that aspect. The liquid precursor material supply is constituted by a holding reservoir-tank 300 for containing a quantity of liquid precursor material similar to reservoir-tank 100 of FIG. 6. Reservoir-tank 300 needs thus not be further described. A gas supply 302, e.g. a supply of argon or nitrogen, is arranged such that by opening a valve 304 the gas pressure from gas supply 302 forces the liquid precursor material into a dispenser 306, which is controlled by a control unit 308. The dispenser 306 is thereby and with an eye on FIG. 8 realized by a micro-dispensing valve as of valve arrangement 220. Micro-doses of liquid precursor material are dispensed into a vaporizer compartment 310, which forms a part of a vapour source of the type described below and in context with a third embodiment of the invention. Vaporizer compartment 310 is heated by a heating element 312. The micro-doses of liquid precursor material are evaporated as described above resulting in a substantially simultaneous evaporation of both components of the liquid precursor material, solvent and coating substance. The vaporizer compartment 310 abuts via a flow diffuser element (not shown in FIG. 11) as of a diffuser element as shown in FIG. 10 and referenced by 236c into the nozzle arrangement 222. The particular nozzle arrangement 222 as realized and schematically shown in FIG. 11 will be described later on in context with the third aspect of the present invention. Nevertheless, perfectly represented in FIG. 11 is a distribution element 350 for ejected vapour, the opening arrangement in the circled area of 221 and the heating element 352 for the distribution element 350, i.e. a part of the surface of vacuum recipient 224 bordering an area in which vapour is ejected.

Third Aspect of the Invention: Vapour Distribution Nozzle Arrangement and Vapour Source Comprising Such Vapour Distribution Nozzle Arrangement The development of the vapour distribution nozzle arrangement and of the respective vapour source comprising such distribution nozzle arrangement takes, as its starting point, the arrangement disclosed in the US 2003/0175422, herein incorporated by a reference in its entirety. The arrangement according to this document was developed for deposition of extremely even lubricant films on hard disks. However, due to differences in properties between lubricant and precursor material comprising a solvent and a coating substance, the vapour distribution nozzle arrangement of this document is not entirely satisfactory for the use in context with such precursor material as addressed in context with the present invention.

Figure 12:
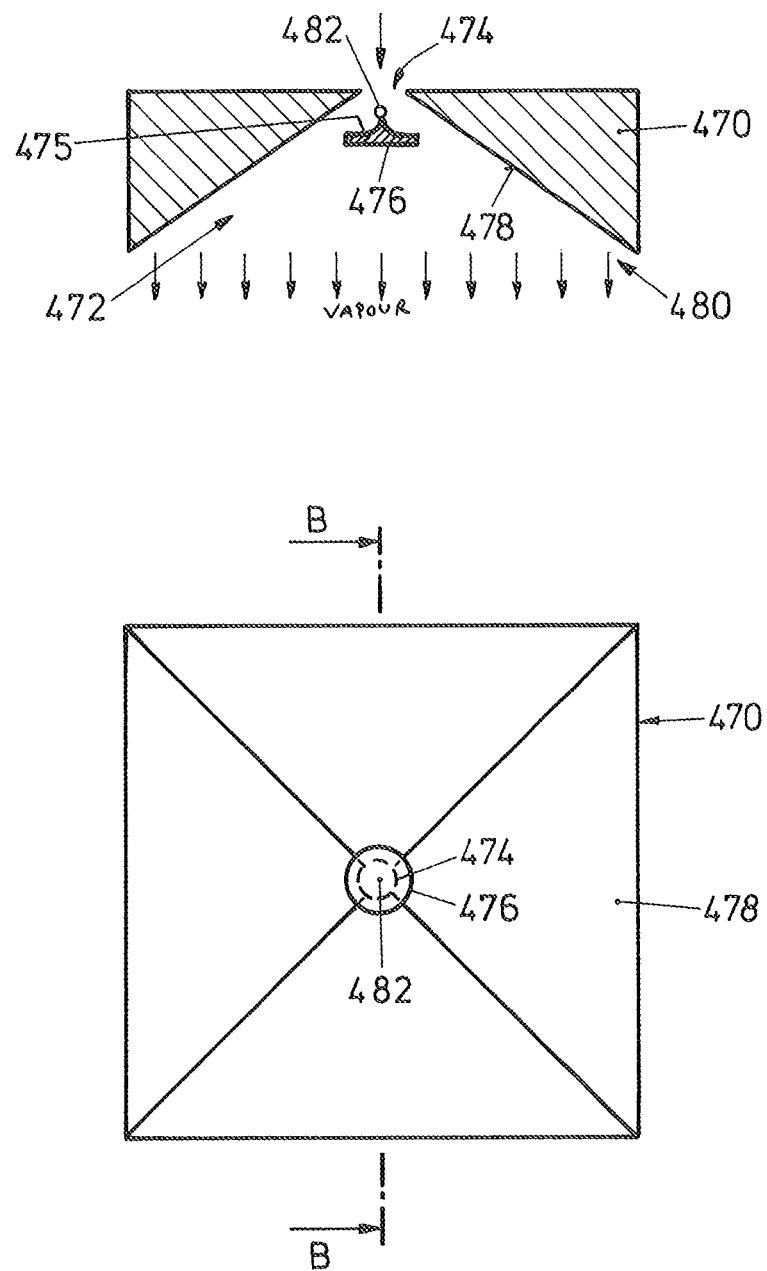

FIG. 12 shows most generically a vapour distribution nozzle arrangement according to the present invention under its third aspect in bottom view and in cross-sectional view along line B-B.

Although the vapour distribution nozzle arrangements exemplified in FIGS. 12 to 19 as well as the respective vapour sources as will be addressed in this context are particularly suited for vapour distribution of precursor material, especially of solvent vapour component and of coating substance vapour component on substrates, it is of course also suited for other applications on direct liquid depositable substances such as on the lubricant of the US 2003/0175422.

The vapour distribution nozzle arrangement comprises a distribution element 470 with a conical or pyramidal-shaped recess 472. As illustrated, the recess 472 is square-pyramidal, however, conical, triangular-pyramidal, pentagonal-pyramidal, hexagonal-pyramidal and so on are foreseeable, depending on the shape and mutual arrangement of one or more than one substrate to be simultaneously coated. At the apex, i.e. the narrowest area of recess 472, the distribution element 470 is provided with an input 474 for vapour, in the present case simply a circular opening. Situated opposite input 474 is a deflection element 476 which is arranged to deflect vapour onto the wall 478 of recess 472 of the distribution element 470. At the widest end of recess 472 is the output 480 of the distribution element 470 and in fact of the vapour distribution nozzle arrangement. Distribution element 470 functions in exactly the same way as described in US 2003/0175422 and needs not be further described. It should be noted that the shape of the vapour distribution as achieved by the vapour distribution nozzle arrangement can be tailored by the shape of the walls 478 of recess 472. For instance shaping the wall 478 to be parabolic or to follow an arc of a circle will result in a more focussed vapour distribution. Suitable materials for distribution element 470 include, but are not limited to, copper and anodized aluminium.

However, deflection element 476 is fundamentally different from the deflection element of US 2003/0175422: In the addressed prior art document the deflection element is formed by a cap provided with a plurality of angled bores to direct the vapour towards the wall of the distribution element. In practice with materials according to the herein-addressed precursor material, especially materials for oleophobic coating deposition on substrates, these angled bores do easily clog due to vapour condensing and autopolymerizing therein. This has a highly negative impact on the quality and evenness of the coating on the substrates.

To overcome this disadvantage, deflection element 476 of the invention comprises a single deflection surface 475 opposite the input 474 so as to deflect the vapour in a ring-shaped distribution pattern towards the wall 478 of recess 472 (see also FIG. 4(*c*)). Since there are no longer any relatively small and long bores through which the vapour must pass, the clogging problem is eliminated and coating quality is improved. The optimal shape of the deflection surface 475 of deflection element 476 depends on the material to be deposited, the geometry of the substrate or of substrates and the geometry of the wall 478, of recess 472 of the distribution element 470. A particularly advantageous form is a "circus tent"-shaped deflection surface 475 with an apex 482. Essentially, the shape is defined by rotation of a concave curve around an axis through apex 482. However, other shapes are foreseeable such as a crucible-shaped surface and various shapes of angular cross-section.

Figure 13:
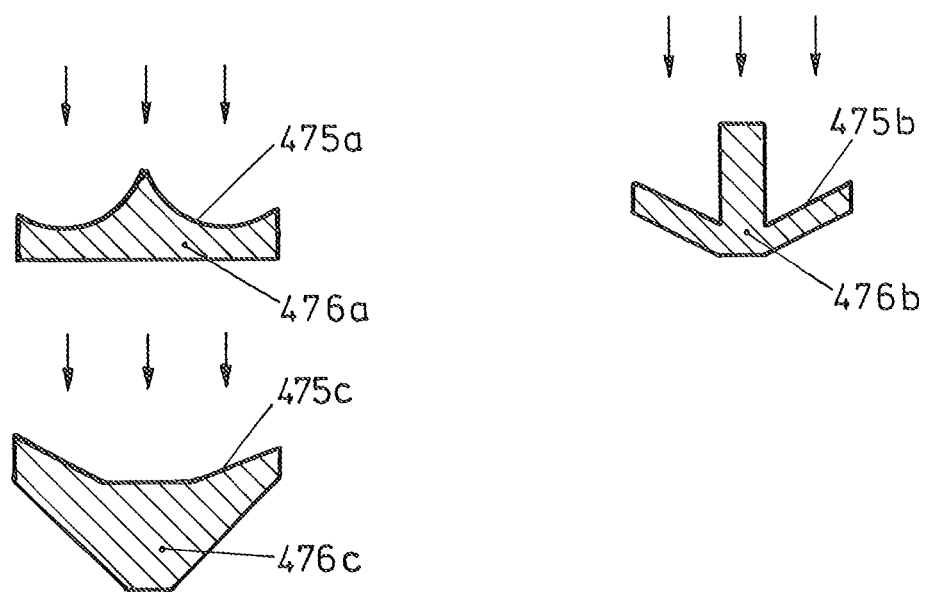

FIG. 13 illustrates a selection of possible reflection element shapes in cross-section, the arrows indicate the direction of impinging vapour. Deflection element 476*a* corresponds to that of FIG. 12. Deflection element 476*b* is of arrow-head cross-section with deflection surface 475*b* presenting an annular straight-sided bowl form. Deflection element 476*c* present a deflection surface 475*c* as a flat bottom straight-sided bowel.

The deflection element shapes given in FIG. 13 are merely qualitative and illustrative: the exact shape of the deflection element is determined by the processing parameters such as temperature and pressure, the nature of the material vapour and the flow rate of vapour and possibly of added transport gas.

Figure 14:
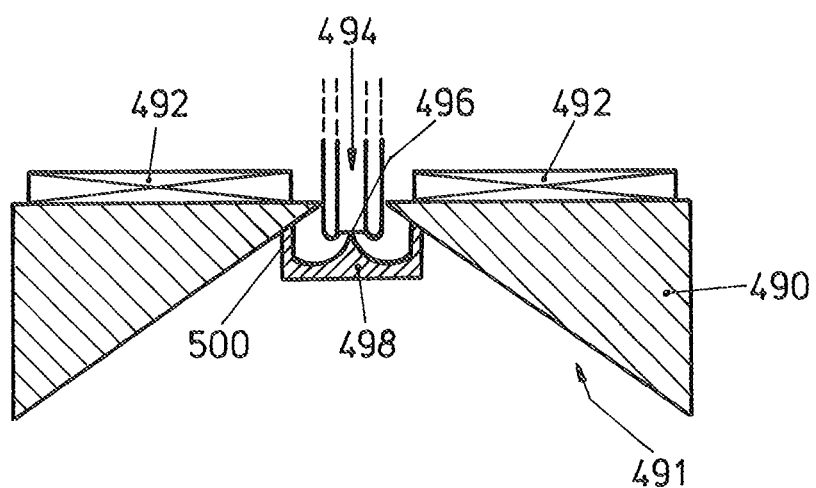
Figure 14:
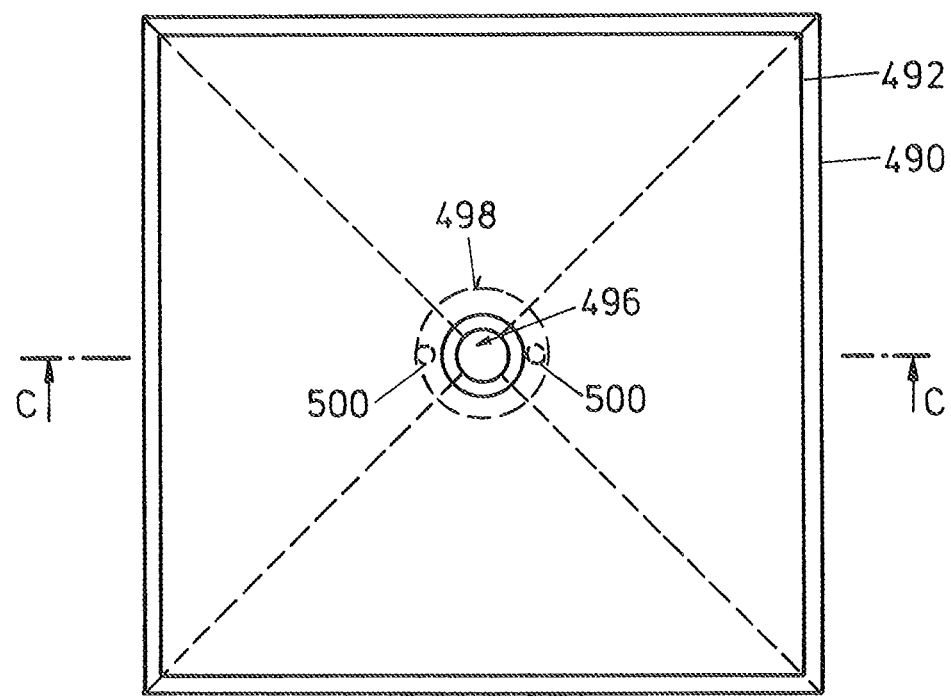

FIG. 14 illustrates in plan view and in cross-section along line C-C, a vapour distribution nozzle arrangement with a thermally coupled distribution element. Distribution element 490 is as described above, thus needs not be described further. On a surface opposite the recess 491 of the distribution element 490 one or more heating elements 492 are provided for heating the distribution element 490. As above, vapour, represented by the arrow 494, is introduced into the distribution nozzle arrangement via vapour input 496. Deflection element 498 is thermally coupled via coupling elements 500 to the bottom of the distribution element 490. These coupling elements may be rods, columns or similar structures and should be kept as small as possible to avoid affecting the vapour ejection distribution pattern while providing sufficient thermal coupling to ensure that the temperature of deflection element 498 is maintained high enough to prevent condensation of the vapour thereupon, even considering a cooling effect from solvent vapour and/or coating material vapour passing along its surface and thereby cooling it.

FIGS. 15 to 19 illustrate in cross-sectional view various embodiments of vapour sources incorporating a vapour distribution nozzle arrangement as described above. In all the illustrations the liquid precursor material supply comprises a reservoir-tank 511 and a micro-dispensing valve 513 as previously discussed. Other liquid material supplies, especially liquid precursor material supplies, may be provided.

Figure 15:
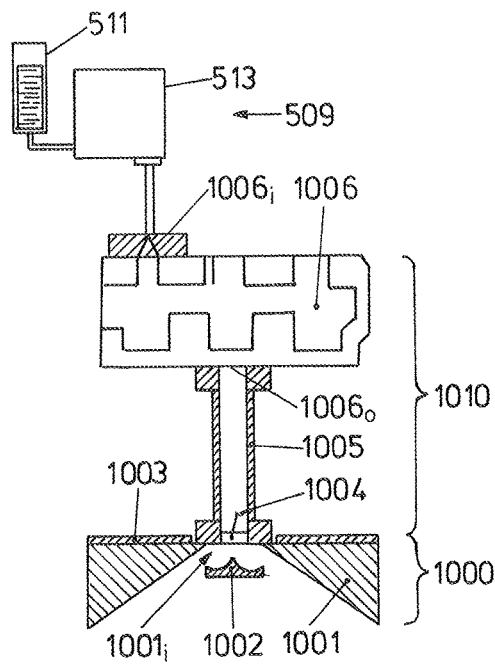

In FIG. 15 vapour distribution nozzle arrangement 1000 comprising a distribution element 1001, a deflection element 1002, a heating element 1003 as described above is in flow connection with a vaporizer unit 1010. The output of the vaporizer unit 1010 provides a supply of vapour to the input 1001$_i$, of the vapour distribution nozzle arrangement 1000. Vaporizer unit 1010 comprises a heated vaporizer compartment 1006 which receives liquid material, especially liquid precursor material, at its input 1006$_i$ and outputs vapour at its output 1006$_o$. Subsequently, the vapour passes along a tube 1005 which may be heated or unheated, and passes via a diffuser element 1004, e.g. of so-called steel foam such as that available from the GOOD FELLOW COMPANY, to input 1001$_i$. Alternatively, the diffuser element may be a gauze, one or more baffle-plates, wire-wool, sintered material or any combination thereof. This equally applies to all other references to diffuser elements or to flow resistance elements throughout the present specification. Moreover, the diffuser element 1004 may be conceived as was addressed in context with FIG. 10, 236*b*, 235*c*. Vaporizer compartment 1006 may be heated with external or integrated heating elements such as by a heated rod.

Figure 16:
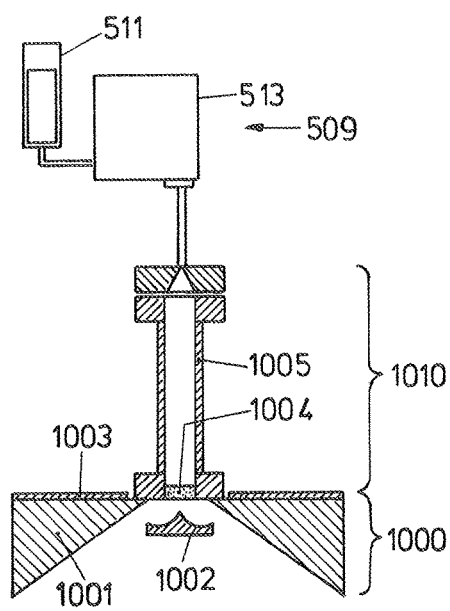

FIG. 16 differs from the embodiment of FIG. 15 in that the heated vaporizer compartment 1006 is omitted and the liquid material, especially liquid precursor material, is dosed directly into tube 1005 which is heated by being thermally coupled with the heated vapour distribution element 1001. Thus, the vaporizer compartment is realized by the tube 1005.

Figure 17:
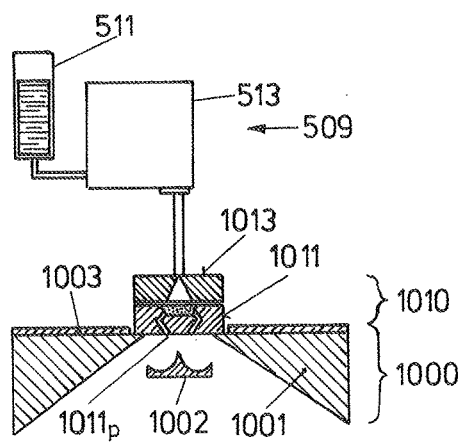

FIG. 17 differs from the embodiment of the FIGS. 15 and 16 in that the vaporizer unit comprises a so-called spider flange 1011 into which the liquid material, especially liquid precursor material, is directly dispensed by the micro-dispensing valve 513. The spider flange is heated by contact and proximity to the heating element 1003. The vapour produced therein passes through passage ways 1011$_p$ defined by the spider flange 1011. The spider flange 1011 thus acts as vaporizer compartment.

Figure 18:
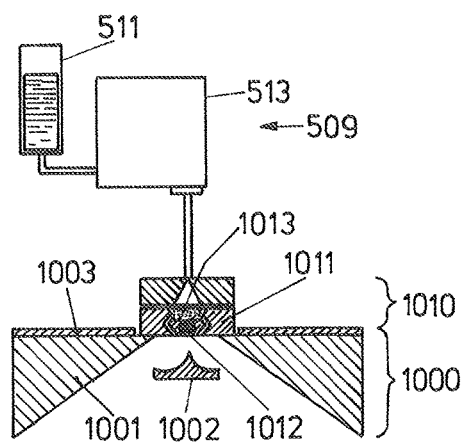

FIG. 18 differs from the embodiment of FIG. 17 in that the spider flange 1011 comprises a heating element 1012 which may be a heated rod. As in the embodiment of FIG. 17, a diffuser element 1013 is located upstream the spider flange 1011 and is e.g. of metal foam as above.

Figure 19:
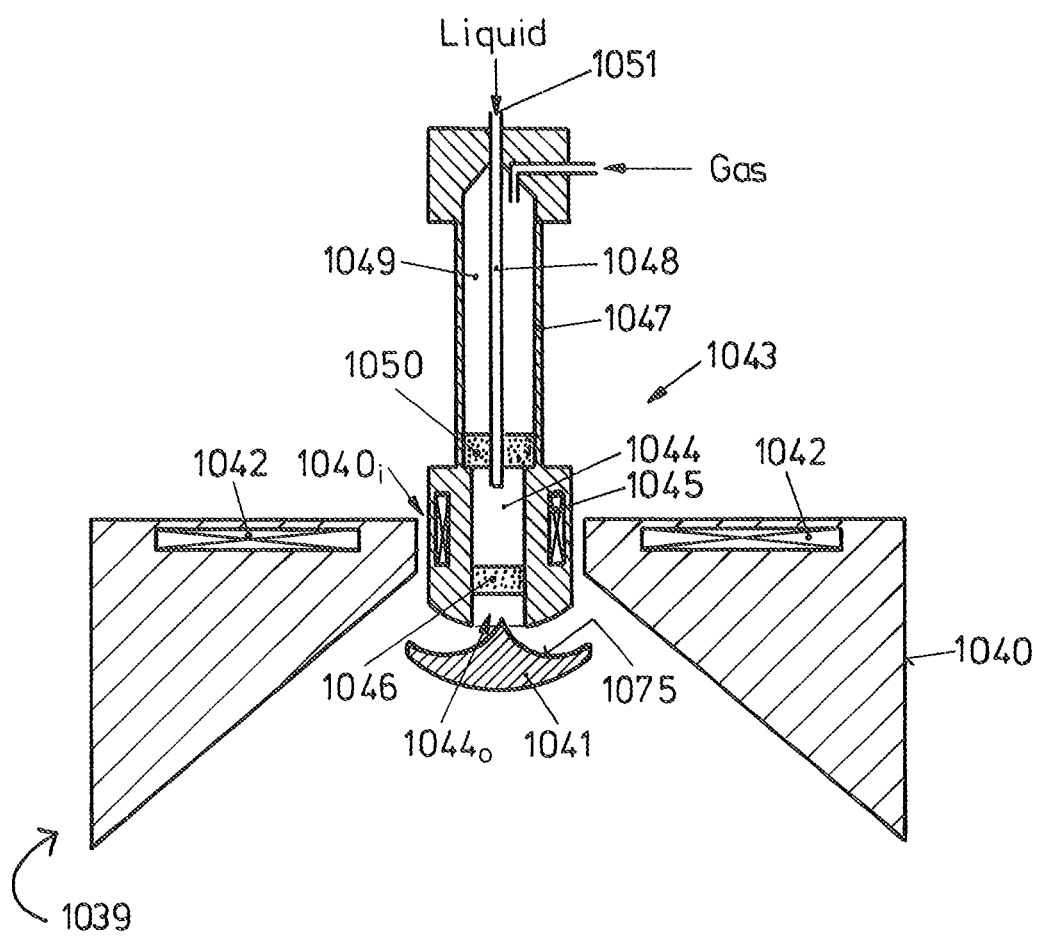

FIG. 19 illustrates in a cross-sectional representation schematically and simplified a vapour source as is used today. Vapour distribution nozzle arrangement 1039 comprises a vapour distribution element 1040 and a deflection element 1041 as described above. Heating element 1042 is here embedded in the material of distribution element 1040, however other arrangements are possible. Protruding through the vapour input 1040$_i$ of the distribution element 1040 there is provided a vaporizer compartment 1044 heated by a heating element 1045 integrated in the side-wall of vaporizer compartment 1044. The vapour output 1044$_o$ of the vaporizer compartment 1044 is directed towards the deflection surface 1075 of deflection element 1041, the apex of which being illustrated here as protruding into the output opening 1044$_o$ of the vaporizer compartment 1044. Vaporizer compartment 1044 may be mounted as convenient, e.g. to the distribution element 1040 or to another component with or without thermal coupling thereto as required.

A diffuser element 1046, e.g. a disk of steel foam or another diffuser material as outlined above is provided at one end of the vaporizer compartment 1044. At the opposite end the vaporizer compartment 1044 abuts in a tube 1047. Along the axis of the tube 1047 extends a lance 1048 which opens into vaporizer compartment 1044. In the lance 1048 liquid material, especially liquid precursor material, is supplied from a material supply, via a micro-dispensing valve as discussed above to the vaporizer compartment 1044.

The interspace 1049 between the outer surface of the lance 1048 and the inner surface of tube 1047 is closed by a further diffuser element 1050, e.g. an annulus of steel foam. The end of the lance 1048 passes through diffuser element 1050 into the vaporizer compartment 1044.

An inert transport gas, such as argon, nitrogen or similar is supplied into the interspace 1049 proximate to a liquid material supply input 1051. Transport gas introduced in the addressed interspace and flowing there along through diffuser element 1050, substantially in a laminar flow, enhances vapour transport out of the vaporizer compartment 1044 through the vapour distribution nozzle arrangement 1039 and onto the substrate (not illustrated).

In all of the embodiments of the FIGS. 15 to 19 deflection element 1002, 1041 may be mounted on and may be thermally coupled to either or both of the distribution elements 1001, 1040 and the vaporizer unit 1010, 1043. Best results have been achieved today with mounting and thermally coupling the deflection element 1002, 1041 to the distribution element 1001, 1040.

The distribution nozzle arrangement and the vapour source according to the third aspect of the present invention and as has been described in context with FIGS. 12 to 19 may be incorporated into the apparatus according to the first or according to the second aspect of the present invention as a distribution nozzle arrangement, including the nozzle, the opening arrangement, the vaporizer compartment and respective flow-interconnections. The same prevails with respect to method aspects of the invention under the third aspect. They are advantageously exploited in context with manufacturing methods according to the first and the second aspects of the invention.

Today especially the embodiment of FIG. 19 has been advantageously applied as nozzle arrangement, nozzle and opening arrangement combined with vaporizer compartment and additional gas flow facilities as have been amply discussed in context with the first and the second aspect of the present invention.

Test Results

The tests were carried out to compare a prior art coating process as described in the above-cited US 2011/0195187 with those of the second aspect of the invention as described above, realized according to the third aspect, especially of FIG. 19.

The substrates were smartphone front panels, comprising a quartz glass prepared by reactive oxygen ion etching followed by deposition of a silicon oxide layer of between 5 and 15 nm thick.

The substrates were treated in pairs (see FIG. 5) in an in-line process on an Oerlikon Solaris machine, at a rate of one pair approximately every 5 seconds.

In the coating step, an oleophobic coating was applied utilising a conventional precursor material available commercially from Daikin. Each dose of precursor material was 3-4 µl, resulting in a coating thickness of between 9 and 12 nm of oleophobic material on the substrate. The substrates were preheated to between 50 and 100° C. After coating, the coated substrates were cured in an environmental chamber at 65° C. in air at 90-95% humidity. The surface of the substrate carrier to be coated so as to achieve a homogeneous coating of the substrates was 170 cm².

The wear resistance of the coating was determined by the well-known water contact angle test, in which a drop of water is placed on the surface of the substrate and the contact angle between the water droplet and the surface is measured. Subsequently, wear of the coating was simulated by drawing a pad of steel wool across the surface of the coated substrate at a contact pressure of 1 kg/cm². The water contact angle was subsequently measured after particular numbers of strokes of the steel wool pad, namely after 10,000 and/or 20,000 strokes. The greater the water contact angle, the better the coating and the less wear it exhibits.

The results of this comparison are presented in the following table:

| Process | Contact angle initial | Contact angle 10,000 strokes | Contact angle 20,000 strokes |
| --- | --- | --- | --- |
| Prior art | 112.5° | 104.8° | Not tested |
| Invention (first test) | 113.6° | 106.3° | Not tested |
| Invention (second test) | 115.2° | Not tested | 112.3° |

Thus the coating process of the invention produces a significant improvement in coating wear resistance over that of the prior art.

Although the invention has been described in terms of specific embodiments, it is not limited to the specific embodiments. The invention is to be understood as incorporating all variations falling within the scope of the appended claims.

The invention claimed is:

1. A method of manufacturing a coated substrate, comprising:
   a) providing a vapour distribution nozzle arrangement in a vacuum recipient, said nozzle arrangement comprising a vapour ejection opening arrangement;
   b) providing an arrangement of at least one substrate in the vacuum recipient;
   c) evacuating the vacuum recipient at the latest when said substrate arrangement is provided therein;
   d) providing a vaporising compartment;
   e) heating said vaporising compartment;
   f) injecting a predetermined portion of a liquid precursor material comprising a coating substance dissolved in a solvent in said vaporising compartment and vaporising said portion by said heating thereby raising the pressure in at least one of in said vaporising compartment and of in said vacuum recipient;
   g) ejecting a result of said vaporising said predetermined portion through said vapour ejection opening arrangement into the vacuum recipient;
   h) establishing in at least one of said vaporising compartment and of said vacuum recipient a pressure course rising to a maximum due to said vaporising and ejecting and dropping by half of the value of said rising in the respective one of said at least one of said vaporising compartment and of said vacuum recipient within at most 10 seconds from reaching said maximum;
   i) establishing a coating of said coating substance on the arrangement of at least one substrate; and
   j) removing said arrangement of at least one substrate from said vacuum recipient after said coating.

2. The method according to claim 1, further comprising ejecting the result of said vaporising in a single shot.

3. The method according to claim 1, further comprising ejecting the result of said vaporising in more than one time-discrete shots.

4. The method according to claim 1, wherein said coating is performed by a single or by more than one of said predetermined portions.

5. The method according to claim 4, wherein said coating is performed by ejecting one or more than one time discrete shots out of the result of said vaporising.

6. The method according to claim 1, further comprising establishing a flow of a gas superimposed to said ejecting.

7. The method according to claim 6, further comprising establishing said flow in an uninterrupted manner at least during said coating.

8. The method according to claim 1, further comprising conveying the result of said vaporizing in a laminar flow of a gas towards said ejecting.

9. The method according to claim 1, further comprising expanding the result of said vaporising into said vacuum recipient, at least one of:
- through a flow resistance element, preferably a flow channel arrangement or a flow diffuser element;
- in a substantially laminar flow towards said expanding;
- thereby performing pumping of said vacuum recipient at least during said coating.

10. The method according to claim 1, wherein said ejecting is performed at least one of:
- coaxially to an axis;
- coaxially to an axis and comprising an ejecting direction component radially outwards from said axis, said component being the predominant component of direction of said ejecting; and
- in a ring-shaped ejection pattern about an axis.

11. The method according to claim 1, wherein the surface of said at least one substrate is pre-treated by at least one of by reactive ion etching and of by depositing a transparent layer.

12. The method according to claim 1, further comprising establishing in the respective one of said at least one of said vaporizing compartment and of said vacuum recipient a pressure course rising to said maximum due to said vaporising and ejecting and dropping by half of the value of said rising in the respective one of said at least one of said vaporising compartment and of said vacuum recipient within at least 0.5 seconds from reaching said maximum.

13. The method according to claim 1, further comprising selecting said predetermined portion to be between $5 \times 10^{-5}$ μl and $5 \times 10^{-2}$ μl per cm² of surface of said arrangement to be coated.

14. The method according to claim 1, further comprising providing said predetermined portion to the said vaporising within at most 30 milliseconds.

15. The method according to claim 1, further comprising sensing a pressure dependent from a pressure in said vaporising compartment and exploiting the result of said sensing for at least one of process monitoring and of process control, in a negative feedback control loop, thereby sensing said dependent pressure in said vacuum recipient and feeding a result of said vaporising in said vaporising compartment to said vacuum recipient via a flow resistance element.

16. The method according to claim 1, wherein the arrangement of at least one substrate is kept centralised with respect to said ejection opening arrangement during said coating.

17. The method according to claim 1, further comprising subsequently providing further arrangements of at least one substrate in said vacuum recipient at a rate of one every at most 20 seconds.

18. The method according to claim 1, further comprising heating said result of said vaporising at least one of before, of during and of after said ejecting, before said coating.

19. The method according to claim 1, further comprising flow communication between said vaporising and said vacuum recipient during said vaporising via at least one flow resistance element.

20. The method according to claim 1, wherein the opening arrangement comprises a distribution element and a deflection element, the distribution element comprising an input for vapour, an output for vapour, and a recess that becomes enlarged in the direction of the output for vapour, the input for vapour being situated at an apex of the recess, the deflection element being configured to direct vapour from the input for vapour towards walls of the recess, the deflection element comprising a single deflection element facing the input for vapour.

21. A method of manufacturing a portable device, comprising:
a) providing a vapour distribution nozzle arrangement in a vacuum recipient, said nozzle arrangement comprising a vapour ejection opening arrangement;
b) providing an arrangement of at least one substrate in the vacuum recipient;
c) evacuating the vacuum recipient at the latest when said substrate arrangement is provided therein;
d) providing a vaporising compartment;
e) heating said vaporising compartment;
f) injecting a predetermined portion of a liquid precursor material comprising a coating substance dissolved in a solvent in said vaporising compartment and vaporising said portion by said heating thereby raising the pressure in at least one of in said vaporising compartment and of in said vacuum recipient;
g) ejecting a result of said vaporising said predetermined portion through said vapour ejection opening arrangement into the vacuum recipient;
h) establishing in at least one of said vaporising compartment and of said vacuum recipient a pressure course rising to a maximum due to said vaporising and ejecting and dropping by half of the value of said rising in the respective one of said at least one of said vaporising compartment and of said vacuum recipient within at most 10 seconds from reaching said maximum;
i) establishing a coating of said coating substance on the arrangement of at least one substrate; and
j) removing said arrangement of at least one substrate from said vacuum recipient after said coating, the coated substrate being a screen of the portable device.

22. The method according to claim 21, wherein the opening arrangement comprises a distribution element and a deflection element, the distribution element comprising an input for vapour, an output for vapour, and a recess that becomes enlarged in the direction of the output for vapour, the input for vapour being situated at an apex of the recess, the deflection element being configured to direct vapour from the input for vapour towards walls of the recess, the deflection element comprising a single deflection element facing the input for vapour.

23. A method of manufacturing a screen of a portable device, comprising:
a) providing a vapour distribution nozzle arrangement in a vacuum recipient, said nozzle arrangement comprising a vapour ejection opening arrangement;
b) providing an arrangement of at least one substrate in the vacuum recipient;
c) evacuating the vacuum recipient at the latest when said substrate arrangement is provided therein;
d) providing a vaporising compartment;
e) heating said vaporising compartment;
f) injecting a predetermined portion of a liquid precursor material comprising a coating substance dissolved in a solvent in said vaporising compartment and vaporising said portion by said heating thereby raising the pressure in at least one of in said vaporising compartment and of in said vacuum recipient;

g) ejecting a result of said vaporising said predetermined portion through said vapour ejection opening arrangement into the vacuum recipient;

h) establishing in at least one of said vaporising compartment and of said vacuum recipient a pressure course rising to a maximum due to said vaporising and ejecting and dropping by half of the value of said rising in the respective one of said at least one of said vaporising compartment and of said vacuum recipient within at most 10 seconds from reaching said maximum;

i) establishing a coating of said coating substance on the arrangement of at least one substrate; and j) removing said arrangement of at least one substrate from said vacuum recipient after said coating, the coated substrate being the screen of the portable device.

24. The method according to claim 23, wherein said screen is a touch screen.

25. The method according to claim 23, wherein the opening arrangement comprises a distribution element and a deflection element, the distribution element comprising an input for vapour, an output for vapour, and a recess that becomes enlarged in the direction of the output for vapour, the input for vapour being situated at an apex of the recess, the deflection element being configured to direct vapour from the input for vapour towards walls of the recess, the deflection element comprising a single deflection element facing the input for vapour.

26. A method of manufacturing a coated substrate using a coating apparatus, the coating apparatus comprising:

a vacuum recipient;

a reservoir for a liquid precursor material comprising a coating substance and a solvent, the reservoir having an output;

a vaporising compartment having a first input and a first output;

the output of said reservoir being operatively connected to the first input via a controllable valve arrangement having a first control input;

a control unit having a first control output operationally connected to said first control input;

a vapour distribution nozzle arrangement comprising a distribution nozzle with a vapour ejection opening arrangement in said vacuum recipient, the vapour distribution nozzle having a second input in operational connection with the first output;

at least one flow resistance element interconnected between said vapour ejection opening arrangement and said first output;

and a substrate carrier in the vacuum recipient positionable opposite said vapour ejection opening arrangement;

the method comprising:

a) providing said vapour distribution nozzle arrangement in said vacuum recipient, said nozzle arrangement comprising said vapour ejection opening arrangement;

b) providing an arrangement of at least one substrate in the vacuum recipient;

c) evacuating the vacuum recipient at the latest when said substrate arrangement is provided therein;

d) providing said vaporising compartment;

e) heating said vaporising compartment;

f) injecting a predetermined portion of said liquid precursor material comprising said coating substance dissolved in said solvent in said vaporising compartment and vaporising said portion by said heating thereby raising the pressure in at least one of in said vaporising compartment and of in said vacuum recipient;

g) ejecting a result of said vaporising said predetermined portion through said vapour ejection opening arrangement into the vacuum recipient;

h) establishing in at least one of said vaporising compartment and of said vacuum recipient a pressure course rising to a maximum due to said vaporising and ejecting and dropping by half of the value of said rising in the respective one of said at least one of said vaporising compartment and of said vacuum recipient within at most 10 seconds from reaching said maximum;

i) establishing a coating of said coating substance on the arrangement of at least one substrate; and j) removing said arrangement of at least one substrate from said vacuum recipient after said coating.

* * * * *